United States Patent [19]
Beausang et al.

[11] Patent Number: 6,012,155
[45] Date of Patent: Jan. 4, 2000

[54] METHOD AND SYSTEM FOR PERFORMING AUTOMATIC EXTRACTION AND COMPLIANCE CHECKING OF AN IEEE 1149.1 STANDARD DESIGN WITHIN A NETLIST

[75] Inventors: James Beausang, Mountain View; Harbinder Singh, Cupertino, both of Calif.

[73] Assignee: Synopsys, Inc., Mountain View, Calif.

[21] Appl. No.: 08/961,389

[22] Filed: Oct. 30, 1997

[51] Int. Cl.$^7$ ........................................................ G06F 7/24
[52] U.S. Cl. ............................................. 714/727; 714/732
[58] Field of Search ..................................... 714/727, 728, 714/726, 729, 733, 30, 732; 395/500.36, 500.19; 702/181

[56] References Cited

U.S. PATENT DOCUMENTS

| | | | |
|---|---|---|---|
| 5,497,378 | 3/1996 | Amini et al. | 714/727 |
| 5,517,637 | 5/1996 | Bruce, Jr. et al. | 395/500.36 |
| 5,572,712 | 11/1996 | Jamal | 395/500.19 |
| 5,708,773 | 1/1998 | Jeppesen, III et al. | 714/30 |
| 5,748,497 | 5/1998 | Scott et al. | 702/181 |

OTHER PUBLICATIONS

Edward B. Pitty, Denis Martin, Hi–Keung Tony Ma, "A Simulation–Based Protocol–Driven Scan Test Design Rule Checker," *International Test Conference*, pp. 999–1006, 1994.

Mascitelli, A. Affidavit of Alida Mascitelli and Attached Exhibits. Jun. 15, 1999.

Dahbura et al., "An Optimal Test Sequence for the JTAG/IEEE P1149.1 Test Access Port Controller", 1989 IEEE, pp. 55–61.

*Primary Examiner*—Albert De Cady
*Assistant Examiner*—David Ton
*Attorney, Agent, or Firm*—Wagner, Murabito & Hao LLP

[57] ABSTRACT

A computerized method and system for automatically extracting an IEEE 1149.1 standard design from a netlist and performing compliance checking. The present invention receives the TAP (test access port) description and compliance enable ports of a netlist. The TAP controller is extracted and its state ports are identified, referenced in a boundary scan design database (BSDD) and its states are verified. The TAP controller is controlled so that the instruction register is located and referenced in the BSDD. The TAP controller is controlled so that the bypass register is found and the BSDD is updated. The TAP controller is controlled so that the shift and update cells of the boundary scan register (BSR) are found, the control, input and output BSR cells are characterized and the BSDD is updated. Primary input and output information is also inferred and the device_ID register is found. Frontier pins are used to locate signatures of the remaining instructions and their test data registers are found. To infer the SAMPLE instruction, instructions selecting the BSR are groups and those that do not exhibit the behavior of the SAMPLE instruction are eliminated. Primary inputs and primary outputs are then inferred. The following instructions are then inferred: INTEST, HIGHZ, CLAMP, IDCODE and RUNBIST. As each of the above elements of the IEEE 1149.1 design are located, they are used to update the BSDD and are also inherently verified for compliance by the present invention. Intolerable violations flag a non-compliant design.

26 Claims, 32 Drawing Sheets

610

| DATA | CLOCK | VAI | OUTPUT | AB. |
|------|-------|-----|--------|-----|
| d | 0 | X | X | NO | 612a
| d | 1 | X | X | NO | 612b
| d | X | X | d | NO | 612c
| d | ↑ | NC | d | YES | 612d
| d | ↑ | X | d | NO | 612e
| X | d | X | d | NO | 612f
| X | X | d | d | NO | 612g
| X | 0,1 | d | d | NO | 612h 614a  614b  614c  614d  614e

FROM THE SET OF INSTRUCTIONS SELECTING THE BSR AS TEST DATA REGISTER, INFER THE INTEST INSTRUCTION BASED ON CAPTURE BEHAVIOR FROM PRIMARY INPUTS AND PRIMARY OUTPUT CONDITIONING — 924

↓

FROM THE SET OF INSTRUCTIONS SELECTING THE BYPASS REGISTER AS TEST DATA REGISTER, INFER THE HIGHZ INSTRUCTION IF THE DESIGN OUTPUTS GO TO 3-STATE OR HIGHZ STATE — 926

↓

FROM THE SET OF INSTRUCTIONS SELECTING THE BYPASS REGISTER AS TEST DATA REGISTER, INFER THE CLAMP INSTRUCTION IF THE DESIGN OUTPUTS ARE CONDITIONED BY THE BOUNDARY SCAN CELL UPDATE STAGE — 928

↓

IN TEST-LOGIC-RESET TAP CONTROLLER STATE, CHECK THE IR (INSTRUCTION REGISTER) IF THE DEVICEID REGISTER IS SELECTED AS TEST DATA REGISTER AND MARK IT AS IDCODE INSTRUCTION — 930

↓

FROM THE SET OF INSTRUCTIONS THAT SELECT THE BSR AS TEST DATA REGISTER, INFER THE RUNBIST INSTRUCTION BASED ON BOUNDARY CELL PRIMARY OUTPUT CONDITIONING OR DESIGN PORT CONDITIONING — 932

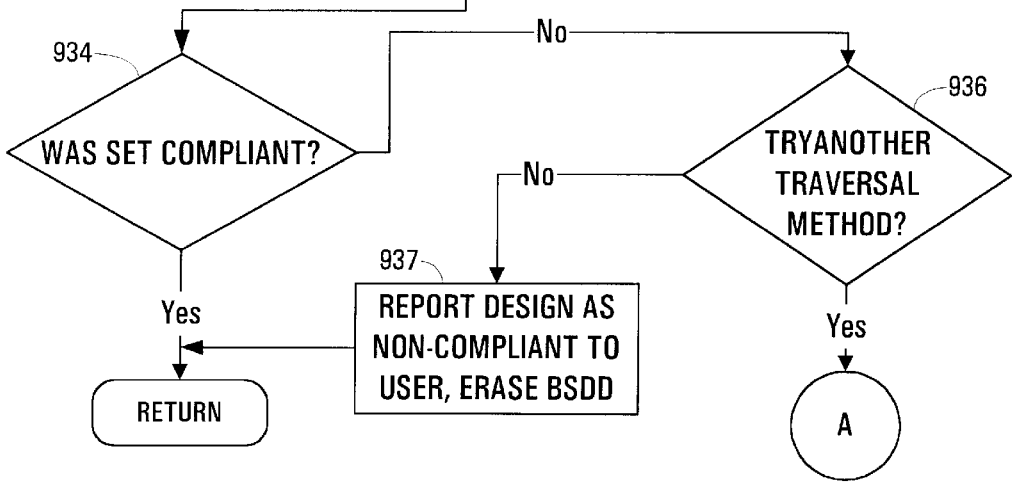

METHOD AND SYSTEM FOR PERFORMING AUTOMATIC EXTRACTION AND COMPLIANCE CHECKING OF AN IEEE 1149.1 STANDARD DESIGN WITHIN A NETLIST

BACKGROUND OF THE INVENTION

1. Field of the Invention

The present invention relates to the field of automatic circuit extraction and verification within a computer system. More specifically, the present invention relates to the field of circuit extraction and simulation for application within a computer controlled electronic design automation (EDA) system.

2. Related Art

The IEEE standard 1149.1, IEEE Standard Test Access Port and Boundary-Scan Architecture, IEEE Standard 1149.1-1990 (including IEEE Standard 1149. 1a-1993), published by IEEE, is a set of rules that define a boundary-scan and test access architecture for integrated circuit designs. The boundary-scan technique puts a shift-register stage (contained in a boundary-scan cell) beside each component pin so that signals at component boundaries can be controlled and observed using scan principles. The test access architecture incorporates design-for-test features like internal-scan paths, BIST (Built In Self-Test) and other support functions.

IEEE Standard 1149.1-1990 (including IEEE Standard 1149.1a-1993) is a set of 192 rules, 49 permissions and 16 recommendations in 12 chapters and 135 description pages. Almost 85% of the rules constrain the functional behavior of the boundary-scan and test access circuitry under different conditions. The remaining 15% of the rules constrain the dedication and isolation of boundary-scan circuitry. BSDL, as defined in the supplement to IEEE Standard 1149.1-1990 & IEEE Standard 1149.1a-1993, IEEE Standard Test Access Port and Boundary-Scan Architecture, published by IEEE, is a subset and standard practice of VHDL (IEEE Standard 1076-1993) that describes the testability features of components that comply to IEEE Standard 1149.1. Integrated circuit (IC), board and system test tools use BSDL to characterize IEEE Standard 1149.1-compliant designs.

It is estimated that about 75% of boundary-scan ICs have hand-generated or macro-cell based boundary-scan circuitry. It is relatively easy to implement the 15% of IEEE Standard 1149.1 rules that constrain the isolation and dedication of boundary-scan circuitry, as the generation of system and boundary-scan logic can be carried out as two separate activities. However, it is not easy to hand-generate circuitry that is in full compliance with the 85% of rules that constrain functional behavior as they require the integration of system and boundary-scan circuitry. Designers can synthesize boundary-scan circuitry at the RTL following "correct-by-construction" design rules, see Robinson M. F., Mailhot F., Konsevich J., "Technology independent Boundary-Scan synthesis", International Test Conference 1993, pp 157–166. Optimization and scan or BIST insertion can introduce compliance problems.

A non-compliant boundary-scan IC may damage itself or other ICs if it can not be isolated. Integrity, interconnect and cluster tests may fail or produce misleading results. Time and test coverage can be lost working around. When boundary-scan design is done by hand, the BSDL description is also hand generated and prone to defects, see Parker, K. P., The Boundary-Scan Handbook, Kluwer Academic Press, 1992, chapter 5, section 5.1.10. Even for synthesized boundary-scan designs, the system generated BSDL description may not be valid, unless the design is verified for compliance to IEEE Standard 1149.1.

Defective BSDL descriptions can get caught when the BSDL is parsed for syntactic and semantic correctness during test generation. Subtle defects may only cause failures on the tester or ATE (Automatic Test Equipment). Such failures may originate in one of several BSDL files or be caused by a real physical defect. It can become quit e expensive to diagnose and resolve such problems. It would be advantageous to provide a computer implemented automatic method for checking design conformance to IEEE Standard 1149.1 and generating correct BSDL descriptions.

Commercially available boundary-scan tool suites generate a set of functional test vectors for the target boundary-scan logic using well-documented strategies. In Dahbura A. T., YAU C. W., Uyar M. U., "An optimal test sequence for JTAG boundary-scan controllet", International Test Conference 1989, pp 55–62, a technique is proposed that generates $$K + k_1 N_{bs} + k_2 N_{ir} + k_3 N_{id}$$

vectors, where k, $k_1$, $k_2$, and $k_3$ are constants. $N_{bs}$ denotes number of boundary scan register (BSR) cells. $N_{ir}$ denotes the number of DIR (Device Identification Register) bits. This approach generates a considerable number of vectors. It only verifies the TAP controller exhaustively and the coverage of test data registers is not complete.

In Raymond D. W., Wedge D. E., Stringer P. J., Harold W. N., Suzanne T. J., Craig T. P., Windsor S., "Algorithmic Extraction of BSDL from 1149.1-compliant Sample ICS", International Test Conference 1995, pp 561–568, it is proposed to extract BSDL from IEEE Standard 1149.1—compliant ICs by simulating the design using hardware and software. However, the BSDL generated is not complete because it includes only the three mandatory instructions (EXTEST, BYPASS and SAMPLE/PRELOAD) and if possible IDCODE. Other instructions (HIGHZ, CLAMP, INTEST or RUNBIST) are not found at all. Moreover, it is not possible to find them using the technique described by Raymond. Further, none of the above techniques offer mechanisms for reducing the exhaustive instruction opcode search processing required for large instruction register bit sizes.

Accordingly, the present invention provides a computer implemented method and system for performing extraction and compliance checking of an IEEE 1149.1 standard circuit. The TAP controller is extracted using an efficient process and then its states are verified. The boundary scan register cells and their primary inputs and primary outputs are characterized. An exhaustive TDR (test data register) check is performed and all supported instructions are extracted (if present) and checked for compliance. The present invention provides novel processes for reducing time required for locating instruction opcodes for designs having large bit sized instruction registers. These and other advantages of the present invention not specifically mentioned above will become clear within discussions of the present invention presented herein.

SUMMARY OF THE INVENTION

A symbolic simulation based method and system are described herein for automatically extracting an IEEE 1149.1 standard design from a netlist and performing compliance checking using a computer implemented process. The present invention receives the TAP (test access port) description and compliance enable ports (and a compliance pattern) of a netlist and performs processing to check if the design is compliant with the IEEE 1149.1 standard. Compliant portions of the IEEE 1149.1 design are referenced into a boundary scan design database (BSDD). In this manner, the BSDD is only populated with compliant elements and compliance is checked in parallel with design extraction. The BSDD is deleted if the design is not compliant.

The TAP controller is extracted using a pruning method and its state ports are identified, referenced in the BSDD and its states are verified. The TAP controller (state elements) is controlled so that the instruction register is located and referenced in the BSDD. The TAP controller is controlled so that the bypass register is found and referenced in the BSDD. The TAP controller is controlled so that the shift and update cells of the boundary scan register (BSR) are found. The control, input and output cells of the BSR are characterized using a Wagner pattern and the BSDD is updated. The TAP controller is controlled so that deviceID register is found. Frontier pins are used to locate signatures of the remaining instructions and their test data registers are found. The opcodes are traversed sequentially to determine the signatures for instruction registers of a given size and a one-hot instruction encoding is assumed for other instruction register sizes to reduce processing time to infer the instructions.

The SAMPLE instruction is inferred by eliminating instructions selecting the BSR that do not act as the SAMPLE instruction. Boundary scan cell primary inputs and primary outputs are inferred by controlling the TAP controller and using EXTEST and SAMPLE in the instruction register. The following instructions are then inferred and analyzed: INTEST, HIGHZ, CLAMP, IDCODE and RUNBIST. As each of the above elements of the IEEE 1149.1 design are located, they are used to generate the BSDL and are also inherently verified for compliance by the present invention. Intolerable violations flag a non-compliant design. The BSDD can be used by various other utilities within the system architecture.

BRIEF DESCRIPTION OF THE DRAWINGS

FIG. 14 is a table illustrating sequential element behavior with respect to TAP controller extraction of the present invention.

FIG. 24B is a flow diagram illustrating steps of the present invention for characterizing and checking a number instructions including SAMPLE, INTEST, HIGHZ, CLAMP, IDCODE and RUNBIST.

DETAILED DESCRIPTION OF THE INVENTION

Figure 1:
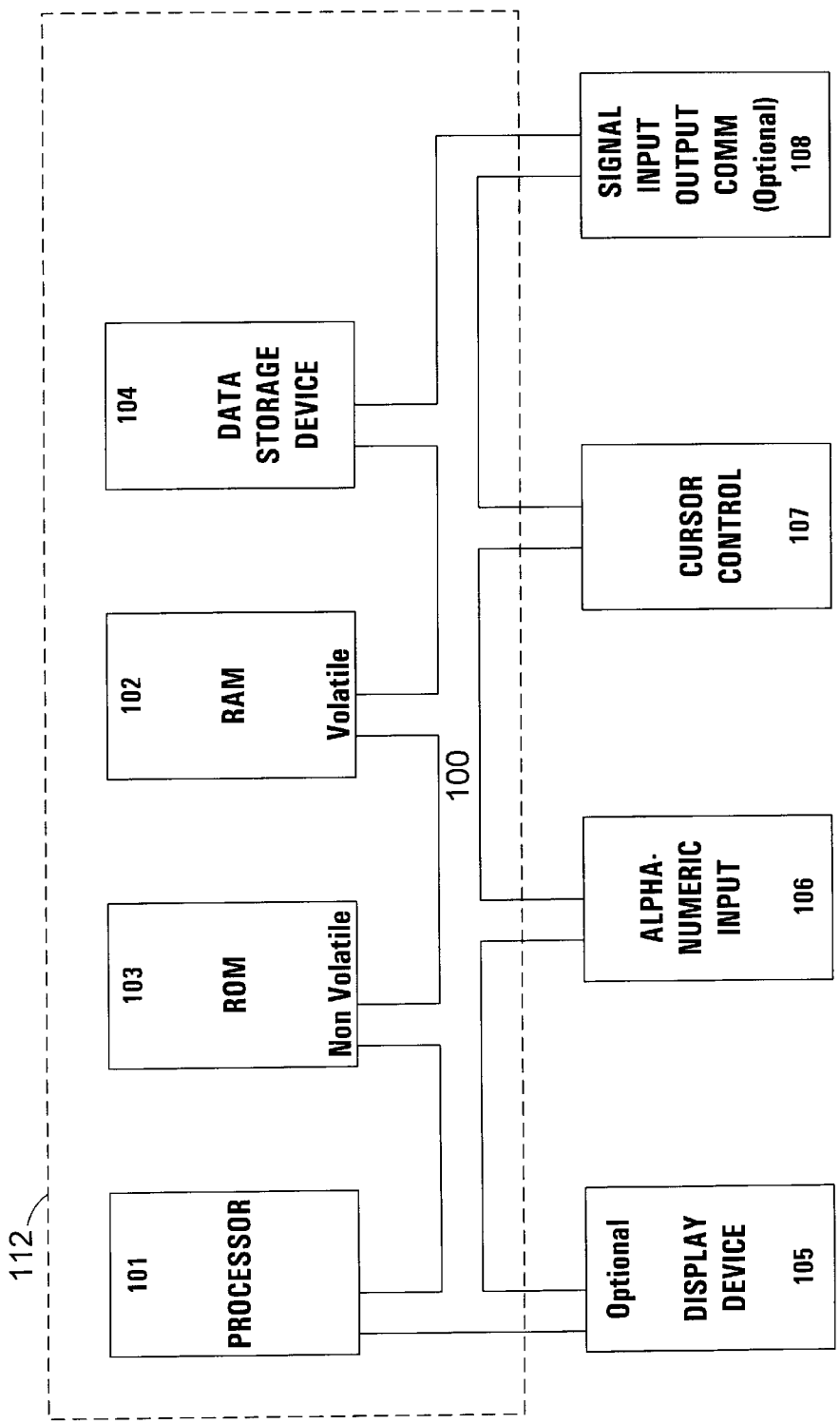
FIG. 1 is a logical block diagram of a general purpose computer system in which an embodiment of the present invention can operate.

In the following detailed description of the present invention, a simulation based computer implemented method and system for performing extraction and compliance checking of an IEEE 1149.1 standard circuit, numerous specific details are set forth in order to provide a thorough understanding of the present invention. However, it will be recognized by one skilled in the art that the present invention may be practiced without these specific details or with equivalents thereof. In other instances, well known methods, procedures, components, and circuits have not been described in detail as not to unnecessarily obscure aspects of the present invention.

NOTATION AND NOMENCLATURE

Some portions of the detailed descriptions which follow are presented in terms of procedures, steps, logic blocks, processing, and other symbolic representations of operations on data bits within a computer memory. These descriptions and representations are the means used by those skilled in the data processing arts to most effectively convey the substance of their work to others skilled in the art. A procedure, computer executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "processing" or "computing" or "translating" or "calculating" or "determining" or "displaying" or "recognizing" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

COMPUTER SYSTEM 112 AND SYMBOLIC SIMULATION

Aspects of the present invention, described below, are discussed in terms of steps executed on a computer system (e.g., processes 200, 215, 500, 640, 700, 740, 760, 810, 816, 818, and 900). Although a variety of different computer systems can be used with the present invention, an exemplary general purpose computer system 112 is shown in FIG. 1.

In general, computer system 112 includes an address/data bus 100 for communicating information, a central processor 101 coupled with the bus for processing information and instructions, a volatile memory 102 (e.g., random access memory RAM) coupled with the bus 100 for storing information and instructions for the central processor 101 and a non-volatile memory 103 (e.g., read only memory ROM) coupled with the bus 100 for storing static information and instructions for the processor 101. Computer system 112 also includes a data storage device 104 ("disk subsystem") such as a magnetic or optical disk and disk drive coupled with the bus 100 for storing information and instructions and a display device 105 coupled to the bus 100 for displaying information to the computer user.

Also included in computer system 112 of FIG. 1 is an alphanumeric input device 106 including alphanumeric and function keys coupled to the bus 100 for communicating information and command selections to the central processor 101. System 112 also includes a cursor control or directing device 107 coupled to the bus for communicating user input information and command selections to the central processor 101. Computer system 112 can also include an optional signal generating device 108 coupled to the bus 100 for interfacing with other networked computer systems. The display device 105 utilized with the computer system 112 of the present invention may be a liquid crystal device, other flat panel display, cathode ray tube, or other display device suitable for creating graphic images and alphanumeric characters recognizable to the user.

Computer system 112 is used by the present invention to perform symbolic simulation within the present invention. Symbolic simulation uses abstract tokens to simulate the design. The symbolic values and the semantics involving these values and operators (logical inverse, logical inclusive-or and logical and) are application-specific. Accurate symbolic simulation is known to be an NP-Complete problem. Simulation semantics can reduce the complexity of the simulation to polynomial time, at the expense of accuracy. Symbolic simulation has been used to verify a set of standard scan-path and ad-hoc Design For Test rules. The present invention uses symbolic simulation to extract IEEE Standard 1149.1—compliant boundary-scan circuitry and verifies that it complies with IEEE Standard 1149.1.

The symbolic simulator used in the present invention is based on a classical three-valued logic simulation with 0,1, and x representing logic-zero, logic-one and logic-unknown respectively. It also supports a pair of values to represent a single bit of scan data and its logical inverse. It also supports a general data value. The propagation of scan data values during simulation is analogous to path-tracing along logically active paths, e.g., non-controlling values are required to be present at all other cell inputs. The propagation of data values during simulation is analogous to path-tracing along all paths except those which are logically-inactive, e.g., no controlling values should be present at other cell inputs.

SYSTEM ARCHITECTURE OF THE PRESENT INVENTION

Figure 2:
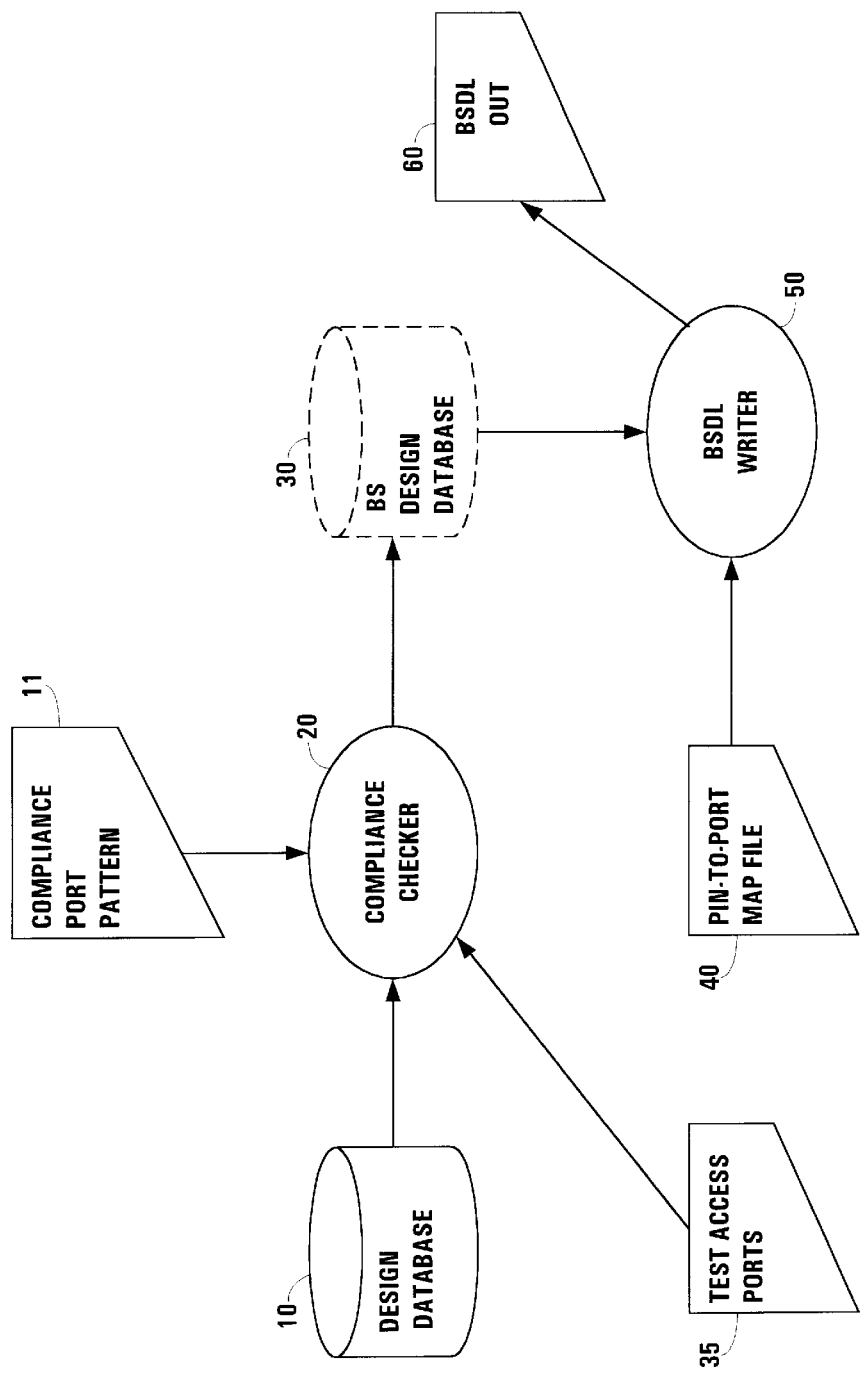
FIG. 2 represents a high level diagram of the system architecture of the present invention.

FIG. 2 illustrates the top level system architecture 5 of the IEEE 1149.1—compliance checker ("compliance checker") 20 of the present invention. Architecture 5 is implemented on system 112. The input to the system 5 is the design database 10 (netlist 10) in any HDL (e.g., VHDL, Verilog etc.) or netlist format. The design 10 should be mapped. The design 10 is received by the compliance checker 20. The user should identify the system clocks so the system can check rules involving boundary scan register (BSR) cells on clock ports. If necessary, the user identifies the test access port (TAP) 35, e.g., the TMS, TDI, TDO, TCK, TRST* (if applicable) pins and this is used as an input to the compliance checker 20. This information can also be obtained from embedded information from a synthesizer. If the design 10 has compliance enable ports then these ports are identified in 11 and at least one compliance pattern is provided (also in 11) to the compliance checker 20.

The compliance checker 20 first extracts the boundary-scan circuitry. It then verifies its compliance to IEEE Standard 1149.1. It populates a BSDD (Boundary-Scan Design Database) 30 only if the extracted circuitry is compliant (e.g., no intolerable violations). From the BSDD 30, the BSDL output file 60 is generated by a BSDL writer 50 after reading a pin-to-port map file 40. In one embodiment, the pin-to-port map file 40 is accepted in Texas Instruments FIZZ format, see Texas Instruments, "Submicron ASIC Products", Design Software Manual, 1995, chapter 19. The BSDL file 60 includes BSDL elements. BSDL is defined in the supplement to IEEE Standard 1149.1-1990 & IEEE Standard 1149.1a-1993, IEEE Standard Test Access Port and Boundary-Scan Architecture, published by IEEE and is a subset and standard practice of VHDL (IEEE Standard 1076-1993) that describes the testability features of components that comply to IEEE Standard 1149.1.

Within an EDA system, the BSDD 30 can be used by other back end tools, in addition to BSDL generation, to analyze the boundary-scan design, generating functional manufacturing test vectors (verification test bench), parametric tests and scan-through-TAP protocols, for example.

BOUNDARY SCAN CIRCUITRY OF EXEMPLARY DESIGN

Figure 3:
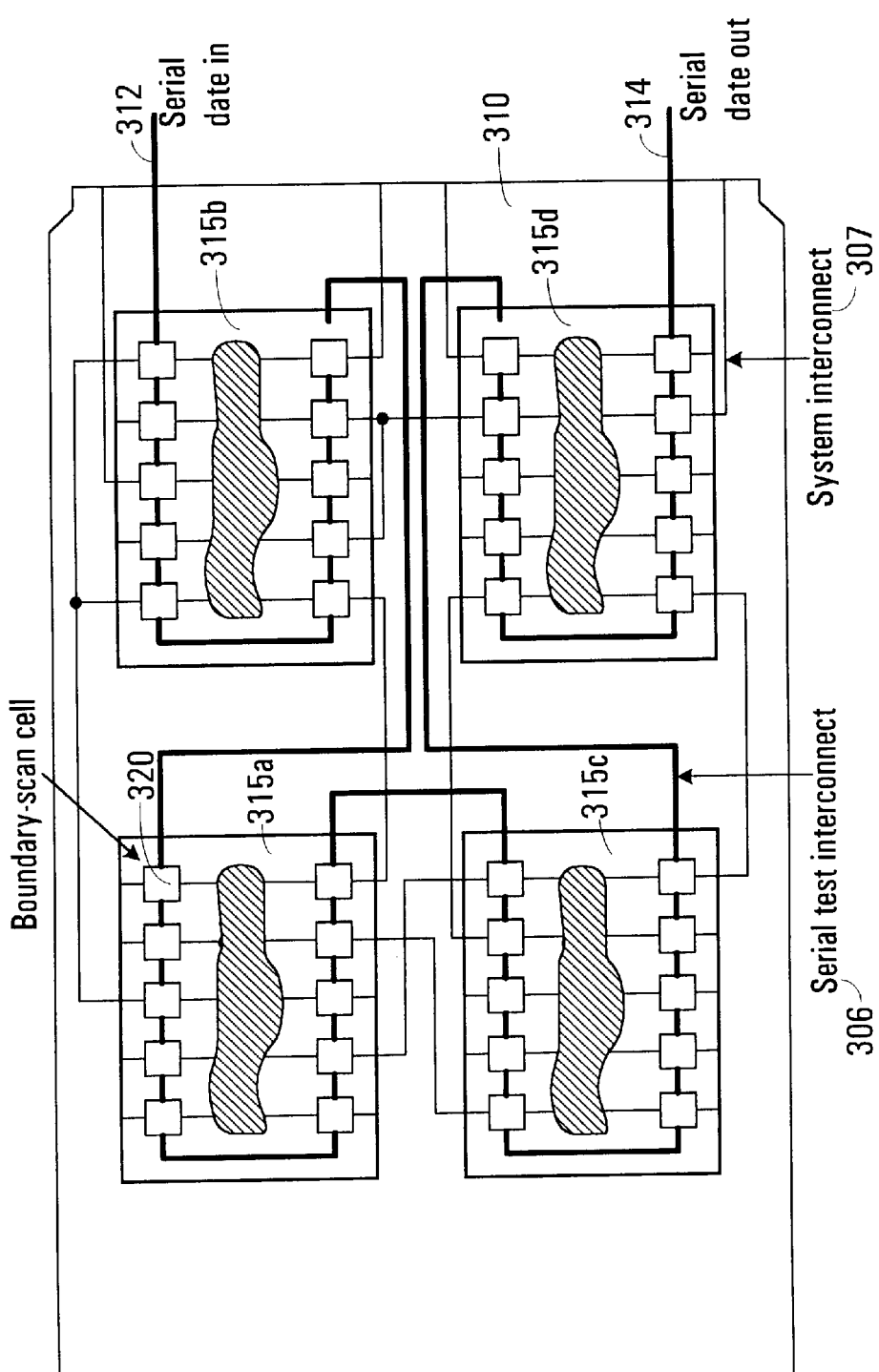
FIG. 3 illustrates a boundary scannable board design including integrated circuit designs implemented in accordance with the IEEE 1149.1 standard.

FIG. 3 illustrates an exemplary integrated circuit board design 305 that can be represented by portions of netlist database 10 (FIG. 2). The board design 305 can contain multiple separate integrated circuit designs 315a–315d which are connected via a serial boundary scan register on which serial data can be routed via input interface 312 and obtained via serial output interface 314. A serial test interconnect 306 bridges the boundary scan register (BSR) cells of adjacent integrated circuit designs. A system interconnect 307 is also illustrated. The boundary scan register is made up of several boundary scan register cells coupled in series fashion; one such boundary scan register cell 320 is particularly illustrated.

Figure 4:
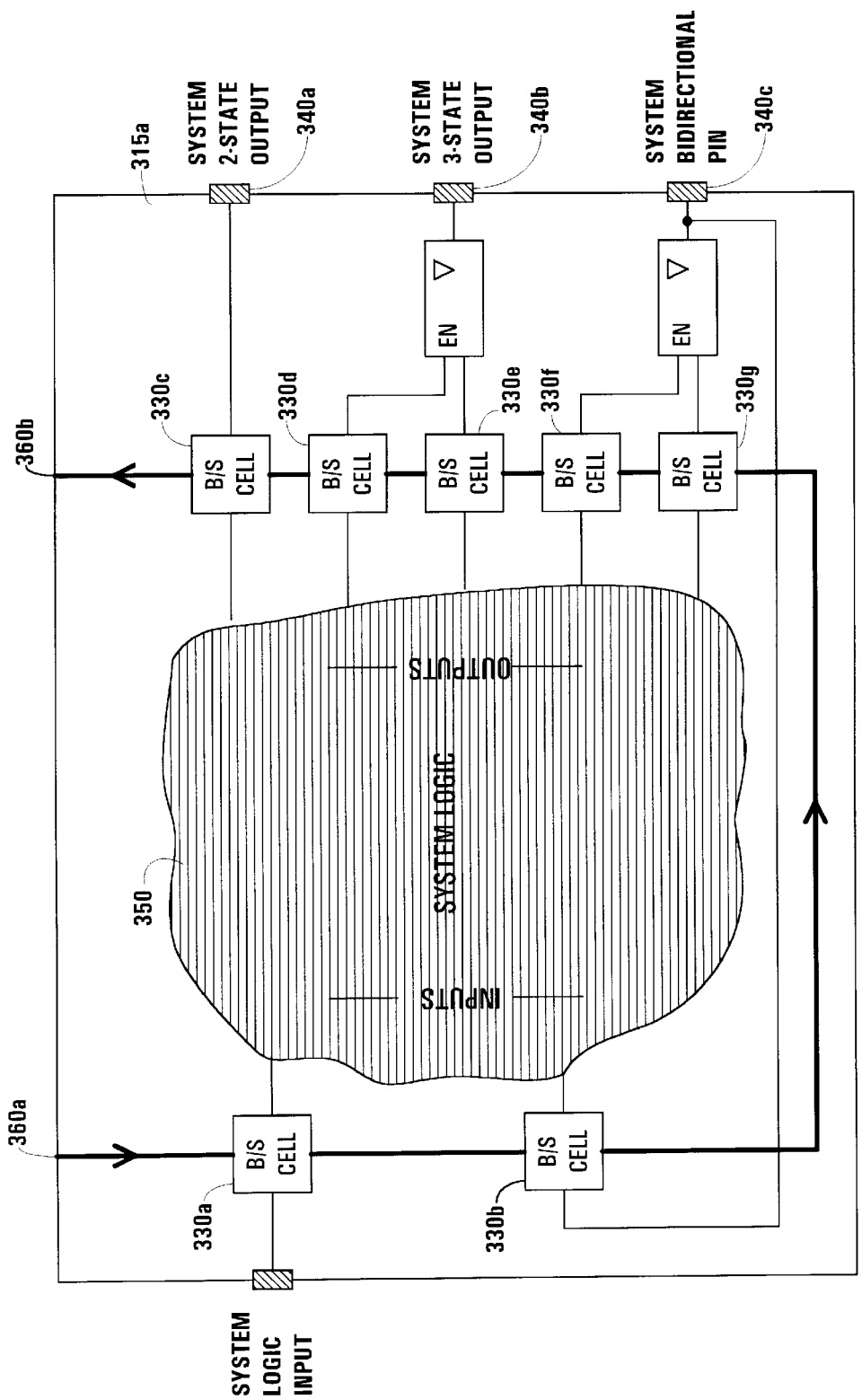
FIG. 4 illustrates the placement of boundary scan register (BSR) cells with respect to system logic.

FIG. 4 illustrates one of the integrated circuit designs 315a in more detail. This design 315a includes a system logic region 350 which receives inputs from input BSR cells 330a and 330b and outputs to output BSR cells 330c, 330d, 330f. It is appreciated that system logic inputs are generally the primary inputs for input BSRs (330a–330b) while the system outputs are the primary outputs for output BSR cells (330c, 330d, 330f). The input 360a and output 360b interfaces of the BSR are also shown. Primary outputs from the input BSR cells (330a, 330b) are coupled to the system logic 350 and primary inputs to the output BSR cells (330c, 330d, 330f) originate from the system logic 350.

Interfacing with the pads of the integrated circuit design 315a of FIG. 4 are system 2-state outputs 340a, system 3-state outputs 340b and system bi-directional pins 340c. The latter two types of output pads are controlled by enable BSR cells 330e and 330g. Within the present invention, a BSR cell is characterized to be an input, output or enable BSR cells and can share multiple functions.

Figure 5:
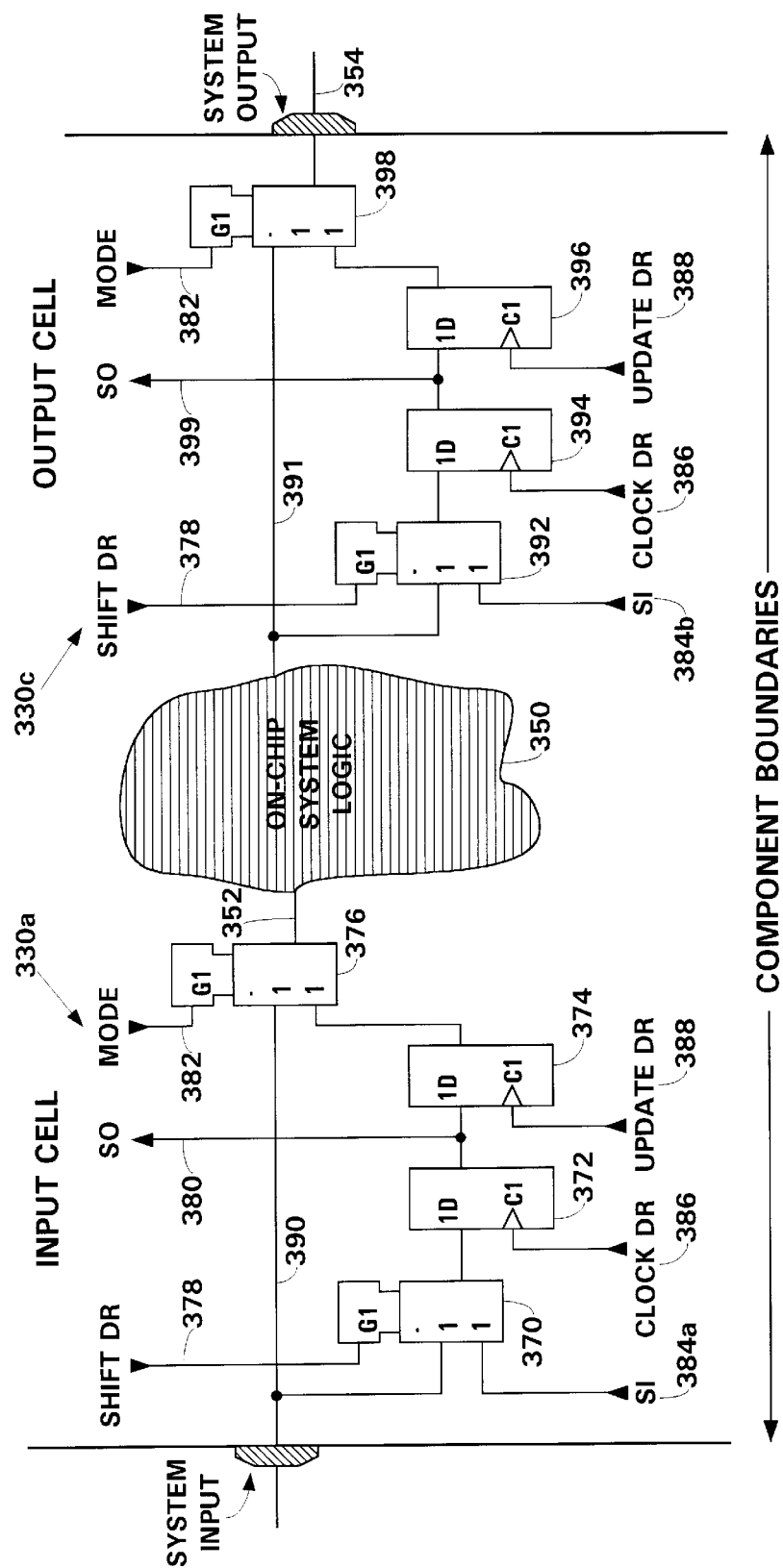
FIG. 5 is an illustration of an input BSR cell coupled to system logic which is coupled to an output BSR cell.
Figure 12:
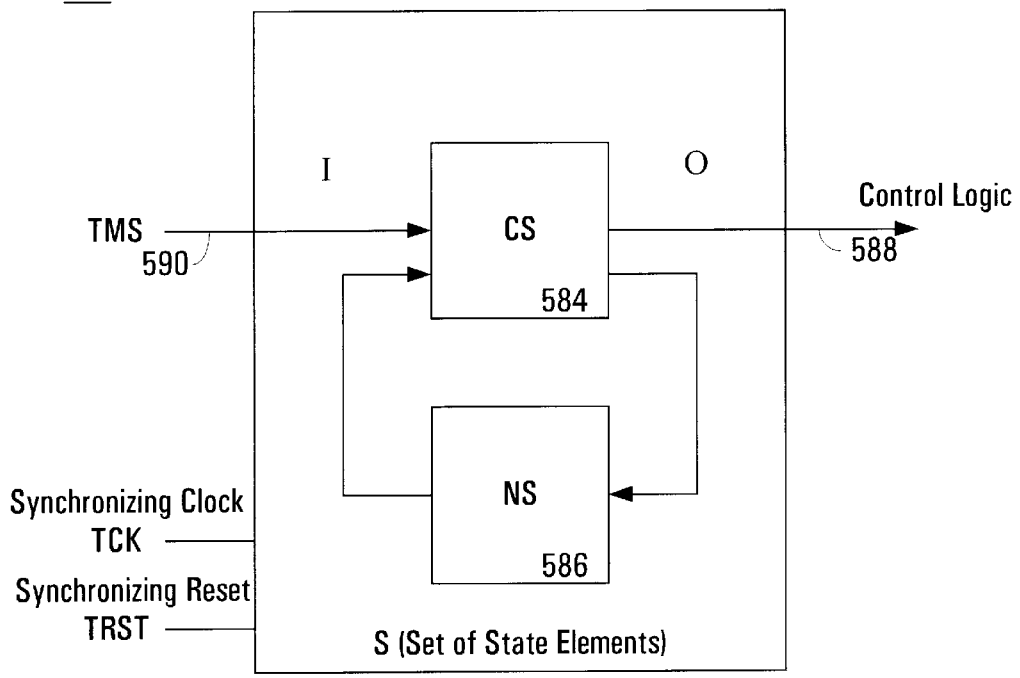
FIG. 12 is a high level block diagram of a TAP controller state machine.

FIG. 5 illustrates the details of one exemplary input BSR cell 330a and one exemplary output BSR cell 330c. The primary input line 390 (from the system input) of the input BSR cell 330a is coupled to an input of multiplexer (mux) 376. The output 352 of the mux 376 is the primary output of cell 330a and is coupled to drive system logic 350. The select line of mux 376 is driven by a mode signal line 382 which is controlled by a TAP controller 595 (FIG. 12). The second input of mux 376 is driven by an output of flip flop (FF) 374 which is clocked by an update DR signal line 388. The FF 374 receives an input from the output of FF 372 which is also coupled to shift out (SO) line 380 to the next stage. The FF 372 is clocked by a clock DR signal line 386. The input of the FF 372 originates from the output of mux 370 which receives a select input from a shift DR signal line 378. One input of mux 370 is from the shift input (SI) line 384a from an adjacent stage and the other input is from primary input 390. The clock signals originate from the TAP controller 595.

FIG. 5 also illustrates the details of an output BSR cell 330c. The primary input line 391 (from the system logic 350) of the output BSR cell 330c is coupled to an input of mux 398. The output 354 of the mux 398 is the primary output of cell 330c and is coupled to drive a system output. The select line of mux 398 is driven by the mode signal line 382 from the TAP controller 595. The second input of mux 398 is driven by an output of flip flop (FF) 396 which is clocked by the update DR signal line 388. The FF 396 receives an input from the output of FF 394 which is also coupled to shift out (SO) line 399 to the next stage. The FF 394 is clocked by the DR signal line 386. The input of the FF 394 originates from the output of mux 392 which receives a select input from the shift DR signal line 378. One input of mux 392 is from the shift input (SI) line 384b from an adjacent stage and the other input is from primary input 391.

Figure 6A:
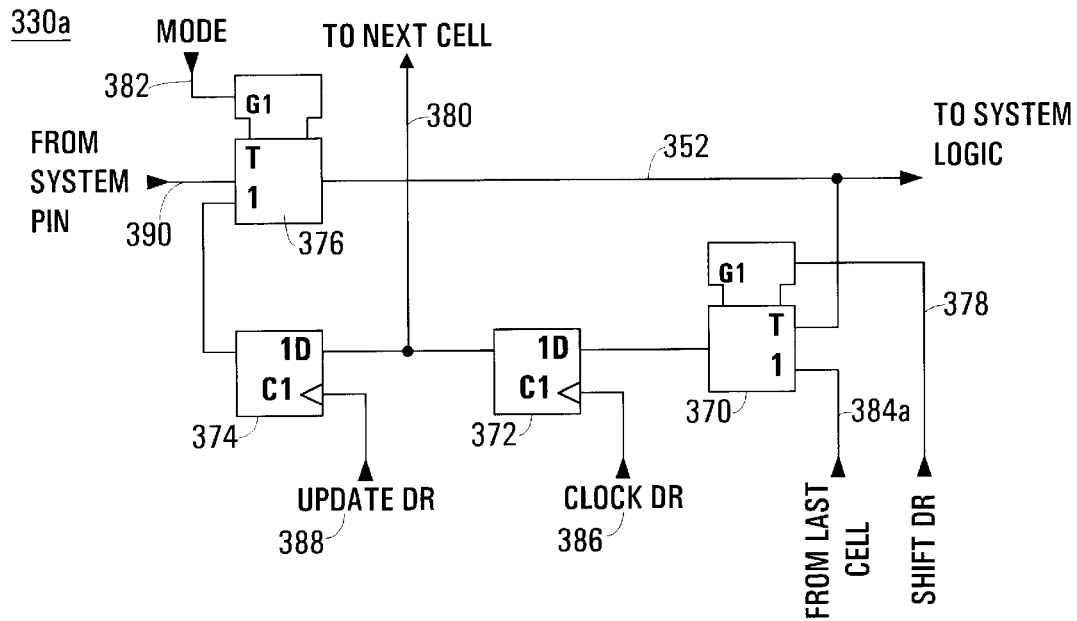
FIG. 6A is a schematic diagram of an input BSR cell and FIG. 6B is a schematic diagram of an output BSR cell.
Figure 6B:
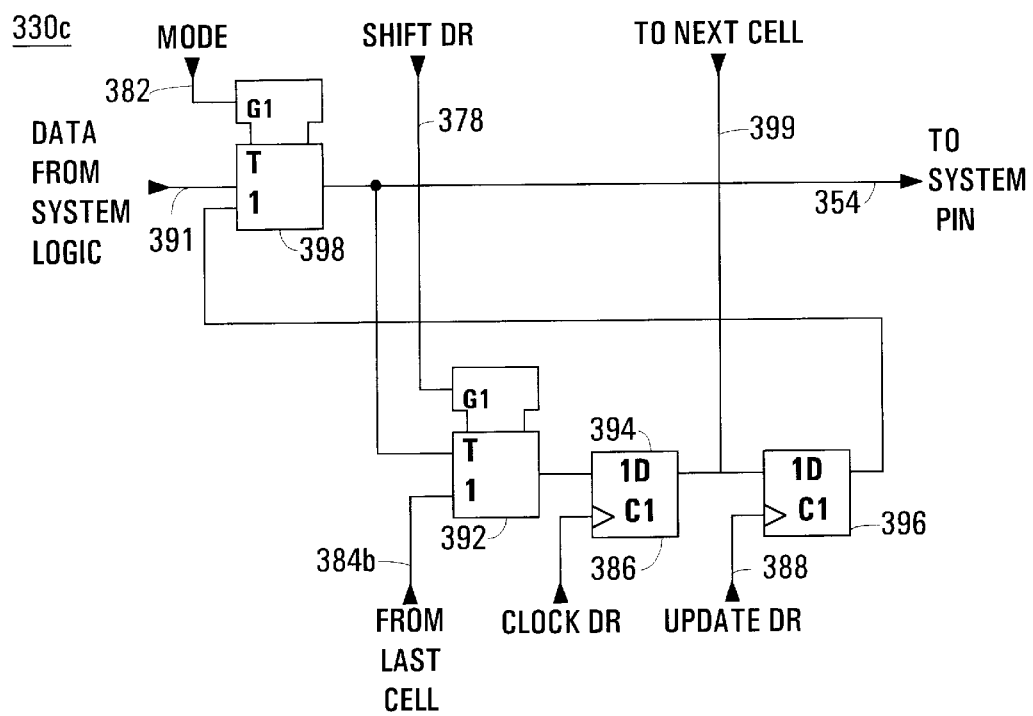

FIG. 6A illustrates the input BSR cell 330a in a different layout configuration but with the same connections and elements. FIG. 6B illustrates the output BSR cell 330b in a different layout configuration but with the same connections and elements.

Figure 7:
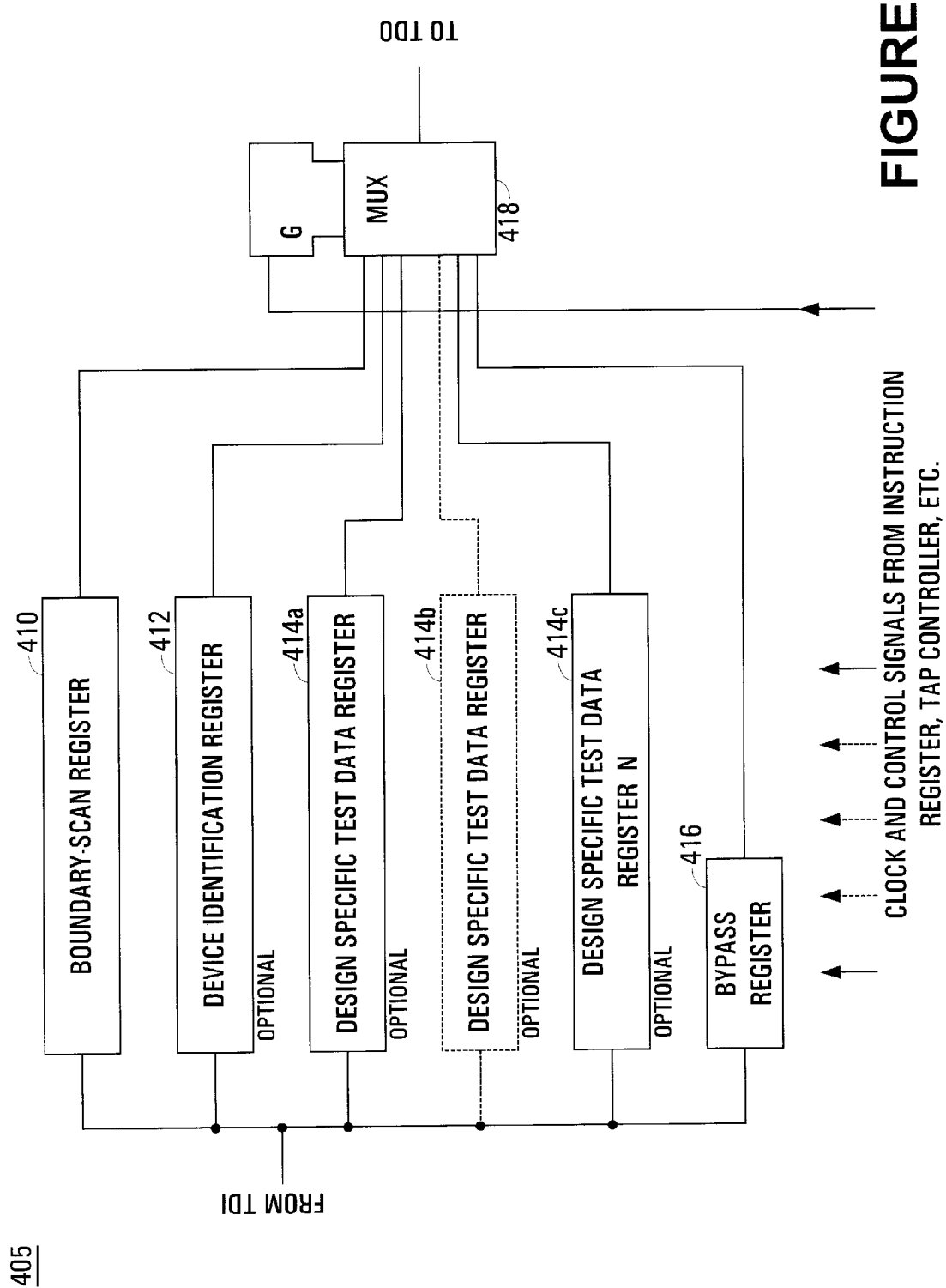
FIG. 7 illustrates an implementation of a group of test data registers selectively coupled between TDI and TDO.

FIG. 7 illustrates circuitry 405 including the test data register cells extracted and verified by the present invention. The cells of a test data register (TDR) are programmably coupled in series between TDI and TDO (as shown) when an instruction that selects the TDR is loaded into the TAP controller 595 (FIG. 12). Circuit 405 is controlled by clock and control signals from the instruction register and the TAP controller 595. Therefore, mux 418 (which generates the TDO signal) is controlled by the TAP controller circuit 595 (FIG. 12). Shown are the boundary scan register (BSR) 410, the device ID register 412, the several design specific registers 414a–414c which have user defined functions, and the bypass register 416.

Figure 13:
FIG. 13 is a diagram of the instruction register located between TDI and TDO.
Figure 18A:
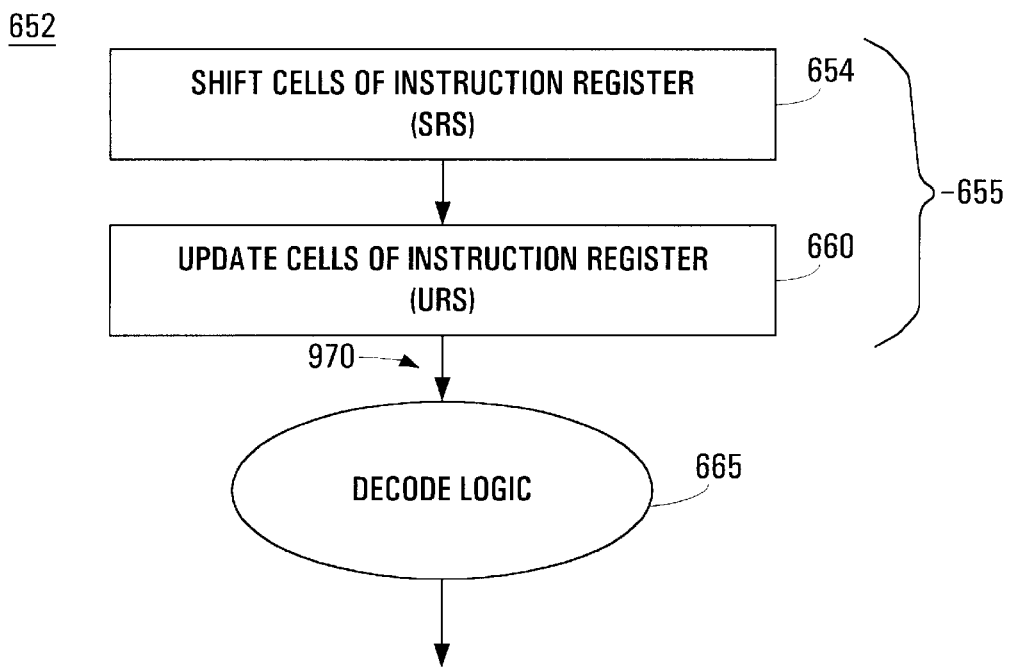
FIG. 18A is an exemplary decoder design with decode logic following the update cells of the instruction register and FIG. 18B is an exemplary decoder design with decode logic before the update cells of the instruction register.

The instruction register (IR) 655, also programmably coupled between TDI and TDO by the TAP controller 595, is shown in FIG. 13. The IR 655 is composed of a shift register portion 654 and an update register portion 660 as shown in FIG. 18A.

Figure 8:
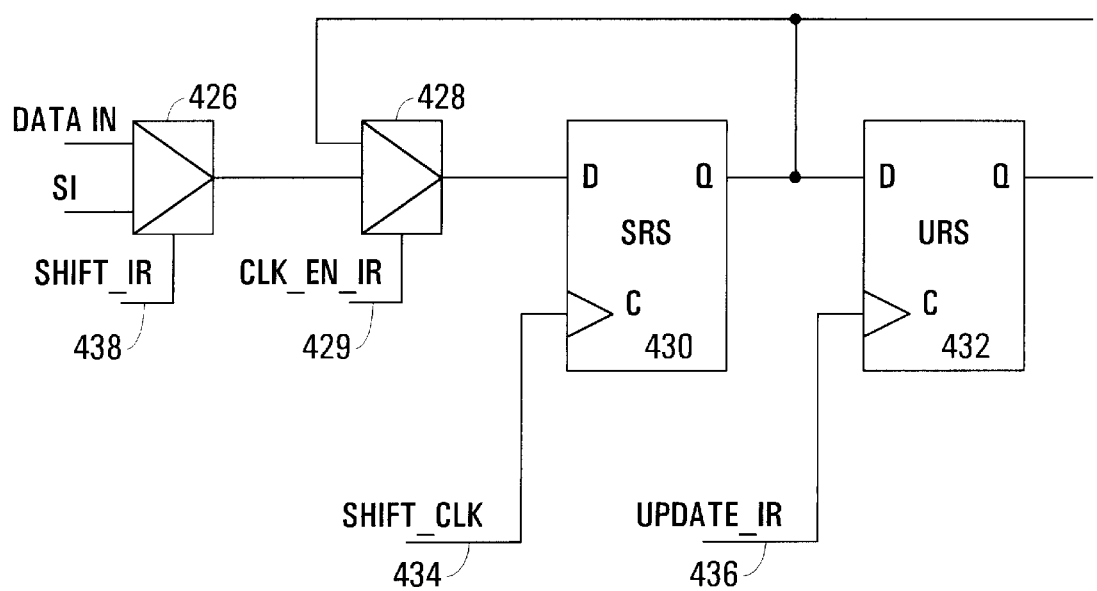
FIG. 8 illustrates an instruction register cell.
Figure 11:
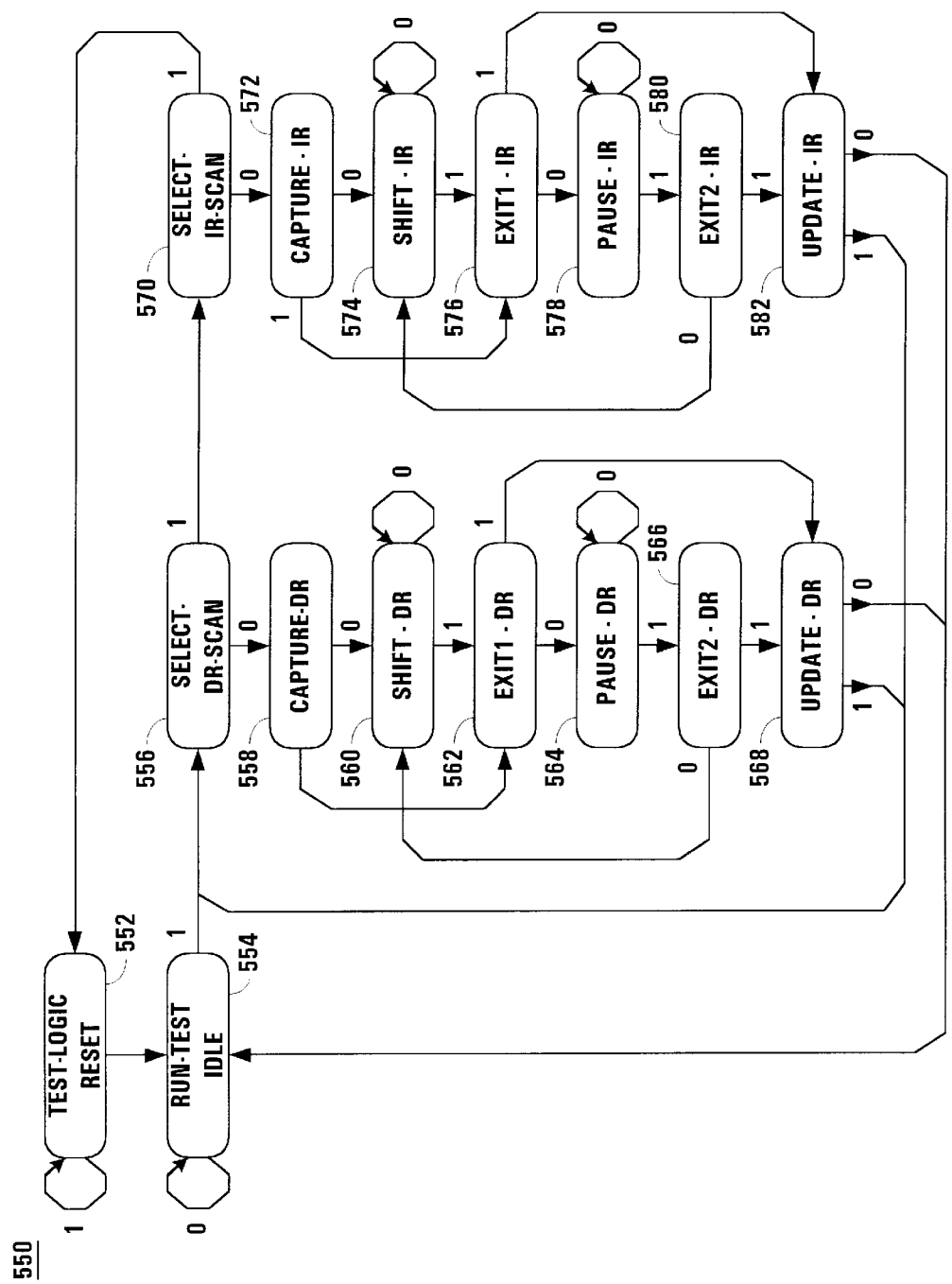
FIG. 11 illustrates the proper states traversed by the TAP controller in accordance with the IEEE 1149.1 standard.

FIG. 8 illustrates one exemplary implementation of an instruction register cell 425 of the IR 655. This cell 425 includes mux circuits 426, 428, and FF circuits 430 and 423. The IR 655 (FIG. 13) includes shift cells 430 and update cells 432. Cell 425 can be made asynchronous by connecting the TAP clock-IR signal to the shift_clk line 434 and setting clk_en_ir 429 high. In a level sensitive synchronous implementation, the TCK signal is connected to shift_clk line 434 and the TAP clock-IR signal is connected to clk_en_ir 429 line. When shifting instruction data between the TDI and TDO lines (in shift-IR state 574 of FIG. 11), the information is captured by the shift cells 430 of the shift portion 654 of the IR 655. The update_ir signal line 436 captures the contents of the shift IR register cells 430 into the update cells 432 in update-IR state 582 (FIG. 11).

EXTRACTION AND COMPLIANCE CHECKING PROCESSES OF THE PRESENT INVENTION

Figures 9A, 9B:
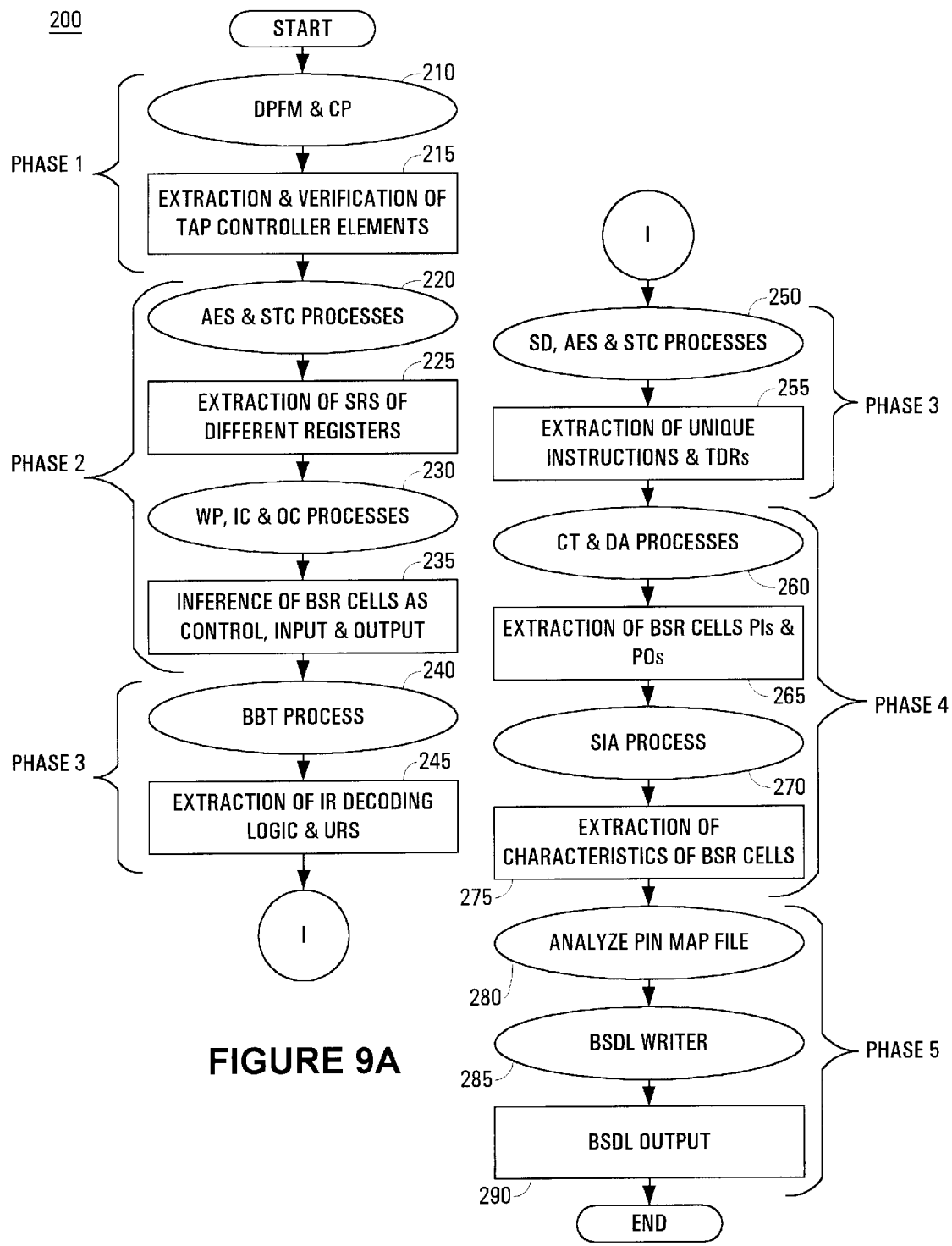
FIG. 9A and FIG. 9B illustrate a high level flow diagram of the control flow of the present invention compliance checker.

FIG. 9A and FIG. 9B illustrate the overall flow 200 of the steps performed by the compliance checker 20 of the present invention to implement design extraction and compliance checking. The particular elements of this flow 200 are described in more by the discussions below which relate back to this process 200 to maintain a consistent framework of operation within this discussion. As described above, process 200, and its subprocesses and steps, etc., are implemented as program code stored in computer readable memory units and executed by the processor 101 of system 112. The data structures stored and manipulated by process 200 are design elements that represent physical elements, structures, and physical signals of a physical integrated circuit.

Extraction and Verification of TAP controller. Phase 1 (process 210 and process 215) of FIG. 9A extracts the TAP controller state elements of the TAP controller 595, including state encoding and clock logic. Two processes, DPFM and CP are used and are described further below. Phase 1 verifies the following: the TAP controller state machine; the TAP controller initialization using TRST, if present, power-up, and the synchronizing sequence of "11111"; the TCK halt state; pull-ups on TDI, TMS and TRST ports; and the state of the TDO port during each TAP controller state.

Figure 10:
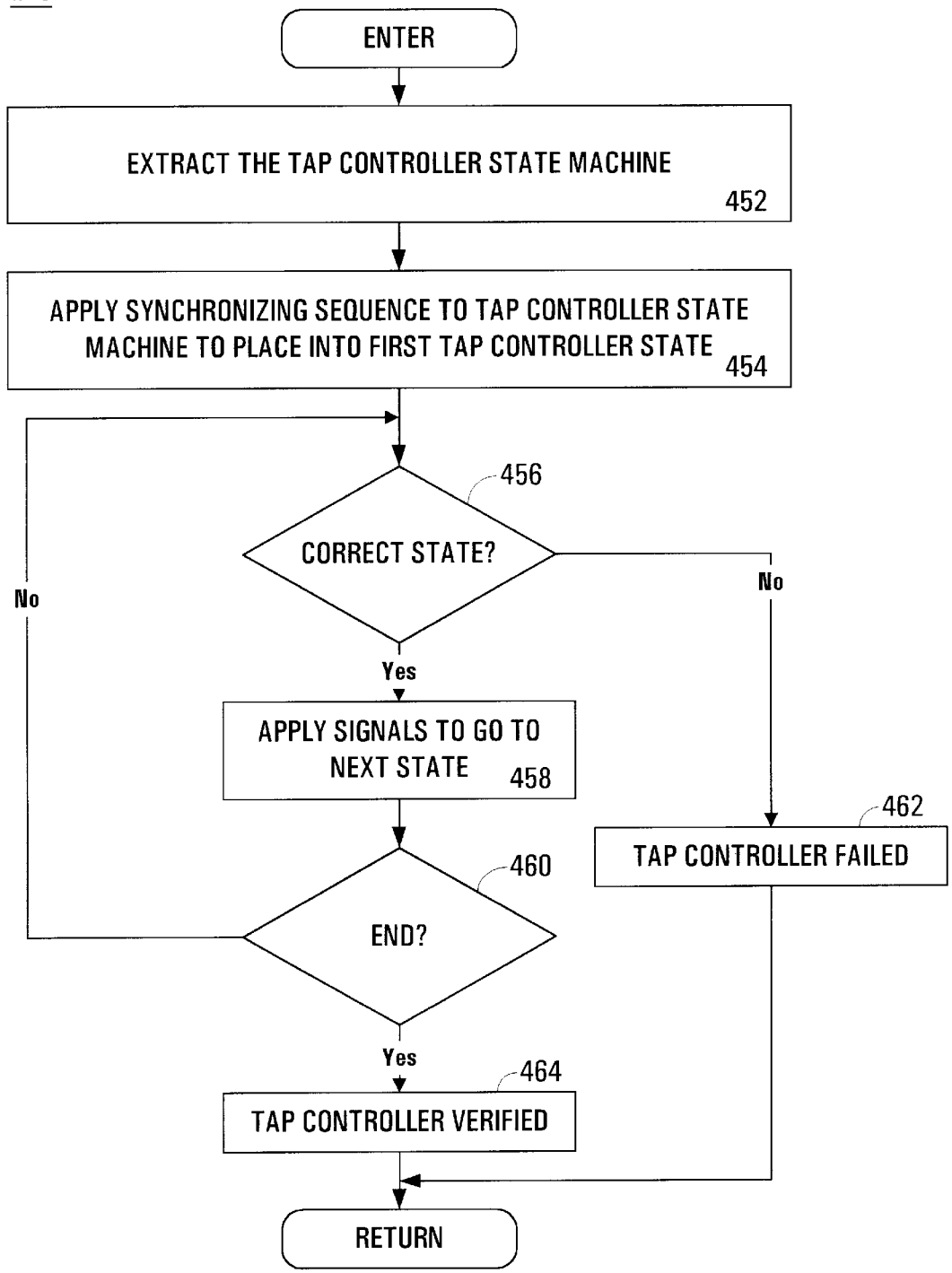
FIG. 10 is a flow diagram illustrating steps performed by the present invention for extracting the TAP (test access port) controller state machine design and verifying its states.

FIG. 10 illustrates the steps of process 215 of the present invention for extracting the TAP controller state machine from the input database 10 (FIG. 2) and for verifying the TAP controller's logic states. At step 452, the present invention extracts the TAP controller state machine. A TAP controller 595, as shown in FIG. 12, is essentially a synchronous 16-state FSM (Finite State Machine). It is a DFA (Deterministic Finite Automaton) and can be represented by the expression:

$$f(I, S, O)$$

where I is the set of inputs (TMS). The synchronizing clock is TCK. The symbol, S, is the set of states that the present invention finds and O is the set of outputs. The TAP controller 595 of FIG. 12 includes a current state circuit 584 and a next state circuit 586. The TMS signal is applied at line 590 and the TCK signal and the TRST signal are also coupled to the TAP controller 595. Output signals 588 go to control other circuitry (e.g., circuit 405 of FIG. 7 as an example).

The TAP controller 595 of FIG. 12 is essentially a Moore FSM, as its output 588 depends solely on its present states. The NS (Next State) and output function can be represented in terms of CS (Current State) by:

$$NS = F(I, CS)$$

$$\text{Outputs} = G (CS)$$

The present invention extracts the FSM of the TAP controller 595 which is embedded inside a pool of logic within database 10 (FIG. 2) where there can be a number of other FSMs. In this case, the characteristics of the FSM are known and the below data propagation and filtration method (DPFM) process is be applied at step 452 of FIG. 10 to extract the TAP controller 595.

This process performed at step 452 of FIG. 10 finds the probable set of SEs (State Elements) in the TAP controller 595 using symbolic simulation. The TRST port is made inactive and a logic-zero is applied to the TCK port. Then symbolic simulation is used to propagate a data token d on the TMS port using a single rising edge of TCK. The state of the design 10 is analyzed and all the sequential state elements (SEs) that have the data token on one of their output states are put into a set of SEs. All the SEs that receive this data token as a result of illegal behavior described in Table 1 (below and reproduced in FIG. 14) are discarded from the set.

Where
VIA: Value of asynchronous inputs of state element;
AB: Acceptable behavior for analysis;
NC: Non controlling signal.

TABLE 1

Sequential Element Behavior

| Data | Clock | VIA | Output | AB |
|------|-------|-----|--------|-----|
| d | 0 | x | x | NO |
| d | 1 | x | x | NO |
| d | x | x | d | NO |
| d | _⌐--- | NC | d | YES |
| d | _⌐--- | x | d | NO |
| x | d | x | d | NO |
| x | x | d | d | NO |
| x | 0, 1 | d | d | NO |

Next, at step 452, the present invention uses a closure pruning (CP) process to prune the set of SEs (State Element) found by the above DPFM process. The CP process uses a closure property on the set. The closure property uses the proximity of SEs to others in the set. Proximity is defined as follows: Given a set S of state elements, s in set S is proximate if there is a t in set S, t≠s, such that there is a path from s to t. Then, t is said to be proximal to s.

The proximity of an SE in the set is proved in accordance with the present invention by carrying out a simulation with a data token on the output of the SE and checking the data in of every SE. A set of proximal SEs is recorded for each SE. The SEs with empty proximal sets are removed. All the remaining SEs proximal sets are recomputed by removing the SEs which no longer part of the proximal set. This procedure stops when no SE has an empty proximal set. The SEs in the set are the TAP controller 595 state elements found by the present invention. If there are fewer than 4 state elements then the design is non-compliant and the process 200 (FIG. 9A) generates an error (e.g., intolerable violation) and exits.

Figure 15:
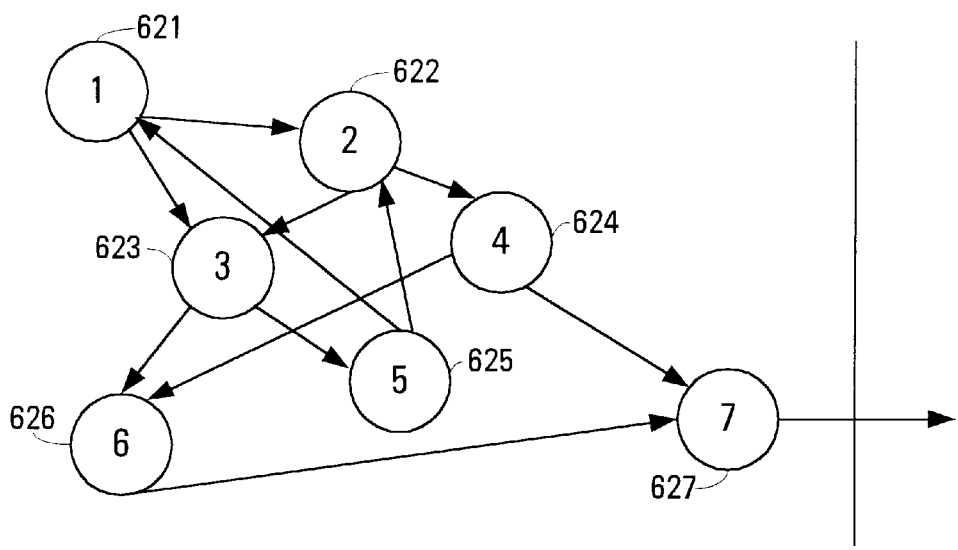
FIG. 15 illustrates a diagram of the closure pruning process used in the present invention for performing TAP controller extraction.

An example is given with reference to FIG. 15. Several SEs are shown 621–627. Assume the nodes are the SEs returned by the above described DPFM process. Edges represent circuit paths between the SEs. The CP process proceeds as follows. The SE 627 is not proximate and is removed from the set of proximal SEs. This makes the SE 626 not proximate. Removing the SE 626 makes the SE 624 not proximate. Removing the SE 624 leaves all remaining SEs proximate. The CP process therefore returns these remaining SEs as the TAP controller 595 SEs.

By determining the sequential elements of the TAP controller 595, process 215 can proceed to step 454 (FIG. 10) to verify the TAP controller states against the IEEE 1149.1 Standard. FIG. 11 illustrates the supported logic states 552–582 that the TAP controller 595 of database 10 needs to implement to be compliant with the IEEE 1149.1 Standard, given the appropriate transition inputs. The transition inputs that are shown in FIG. 11 that cause the respective state transitions are applied through clocking values on the TMS signal. Of particular importance are the test-logic-reset state 552 (test-logic state), the run-test-idle state 554 (run-test state), the capture-IR state 572 (capture-IR), the shift-IR state 574 (shift-IR), the capture-DR state 558 (capture-DR), the shift-DR state 560 (shift-DR), the update-DR state 568 (update-DR) and the update-IR state 582 (update-IR).

After the extraction of TAP controller SEs, the functionality of the TAP controller 595 is verified by steps 454–464 by traversing all possible states. TAP controller initialization is checked by using either the TRST port or the power up sequence. The state found is encoded as test-logic-reset state 552. Then the TAP controller 595 is put into a random state checked. The TCK halt state is also checked. The pull ups on the TDI, TMS and TRST ports are also verified as part of process 215.

Table 2 below illustrates a 16×16 matrix of TMS signals that can be applied to the TAP controller, in one embodiment of the present invention, to traverse states in accordance with FIG. 10.

TABLE 2

```
static const string bsd_fsm_trans_mat[16][16] = {
{"1", "111", "11", "11111", "11111", "1111", "11111", "1111", "111", "1", "11111",
"11111", "1111", "11111", "1111", "111"},           /* To BSD_TEST_LOGIC_RESET */
{"0", "0", "110", "110", "110", "10", "110", "10", "0", "10", "110", "110", "10", "110",
"10", "0"}                                          /* To BSD_RUN_TEST_IDLE */
{"01", "1", " ", "111", "111", "11", "111", "11", "1", "101", "111", "111", "111", "11",
"111", "11", "1"}                                   /* To BSD_SELECT_DR_SCAN */
{"010", "10", "0", " ", "1110", "110", "1110", "110", "10", "1010", "1110", "1110",
"110", "1110", "110", "10"}
{"0101", "100", "00", "0", "0", "010", "10", "0", "100", "10100", "11100", "11100",
"1100", "11100", "1100", "100"},                    /* To BSD_SHIFT_DR */
{"0101", "101", "01", "1", "1", "", "101", "01", "101", "10101", "11101", "11101",
"1101", "11101", "1101", "101"},                    /* To BSD_EXIT1_DR */
{"01010", "1010", "010", "10", "10", "0", "0", "010", "1010", "101010", "111010",
"111010", "11010", "111010", "11010", "1010"},      /* To BSD_PAUSE_DR */
{"010101", "10101", "0101", "101", "101", "101", "01", "1", "", "10101", "1010101",
"1110101", "1110101", "110101", "1110101", "110101", "10101"},
                                                    /* To BSD_EXIT2_DR */
{"01011", "1011", "011", "11", "11", "1", "11", "1", "", "101011", "111011",
"111011", "11011", "111011", "11011", "1011"},      /* To BSD_UPDATE_DR
*/
{"011", "11", "1", "1111", "1111", "111", "1111", "111", "11", "", "1111", "1111",
"111", "1111", "111", "11"},                        /* To BSD_SELECT_IR_SCAN
*/
{"0110", "110", "10", "11110", "11110", "1110", "11110", "1110", "110", "0", "",
"11110", "1110", "11110", "1110", "110"},           /* To BSD_CAPTURE_IR */
{"01100", "1100", "100", "111100", "111100", "11100", "1111100", "11100",
"1100",
"00", "0", "0", "010", "10", "0", "1100"},          /* To BSD_SHIFT_IR */
{"01101", "1101", "101", "111101", "111101", "11101", "111101", "11101",
"1101",
"01", "1", "1", "", "101", "01", "1101"},           /* To BSD_EXIT1_IR */
{"011010", "11010","1010", "1111010", "1111010", "111010", "1111010",
"111010",
"11010", "010", "10", "10", "0", "0", "0", "11010"}, /* To BSD_PAUSE_IR */
{"0110101", "110101", "10101", "11110101", "11110101", "1110101",
"11110101",
"1110101", "110101", "0101", "101", "101", "01", "1", "", "110101"},
                                                    /* To BSD_EXIT2_IR */
{"011011", "11011", "1011", "1111011", "1111011", "111011", "1111011",
"111011", "11011", "011", "11", "11", "1", "11", "1", ""}
                                                    /* To BSD_UPDATE_IR */
};
``` and the synchronizing sequence "11111" (TMS ticked five times) is used during simulation to reset the state to test-logic-reset state 552 at step 454 of FIG. 10. This state is also encoded and compared to the state reached by initialization. If the two states are not the same, then the state reached by the synchronizing sequence is taken as the test-logic-reset state 552 and all other states are encoded by simulating the TAP controller 595 through the expected states as shown in FIG. 11.

During the simulation, if a state is not reached that should be reached according to the state diagram of FIG. 11, then step 456 causes process 215 to enter step 462 (FIG. 10) where the TAP controller 595 fails (an intolerable violation). Otherwise, at step 458 another transition is performed. Step 460 checks for a predetermined end sequence and, at step 464, the TAP controller 595 is marked as verified if no state errors are detected. If all the states are traversed properly then the state elements and state encoding are stored in the BSDD 30 (FIG. 2) subsystem. During the traversal through each TAP controller state the TDO port conditioning is Phase 2 of FIG. 9A extracts the shift register stage (SRS) of different registers. The SRS of the IR 655 is extracted by putting the TAP controller 595 into the shift-IR state 574. It then extracts the SRS of the bypass register 416 after forcing the all-1s opcode into the SRS of the IR 655 and taking the TAP controller 595 to the shift-DR state 560. It then extracts the SRS of the DIR (Device Identification Register) 412, if there is one, by putting the TAP controller 595 into the test-logic-reset state 552. It extracts the SRS of the BSR 410 by forcing the all-0's opcode into the SRS of the IR 655 and taking the TAP controller 595 to the shift-DR state 560. It also extracts the URS (update register stage) of all controllable BSR cells.

The present invention also identifies the BSR cells that control, sense or drive design ports. The present invention verifies: the length of the instruction register 655; the loading of the 01 pattern into the least significant bit locations of the IR 655 in the capture-DR 558 state; there is no inversion of data between the TDI and TDO of any TDR; the behavior of the IR 655 during each TAP controller state; the latching of the instruction on the falling edge of TCK;

the all zeros instruction corresponds to EXTEST; the all ones instruction corresponds to BYPASS; the length of the bypass register 416 and its capture value; the length of any device_ID register 412 and its capture value; a manufacturing code is not 00001111111; and that BSR cells are provisioned to each design port. The above processes of Phase 2 are described in more detail below.

Figure 16:
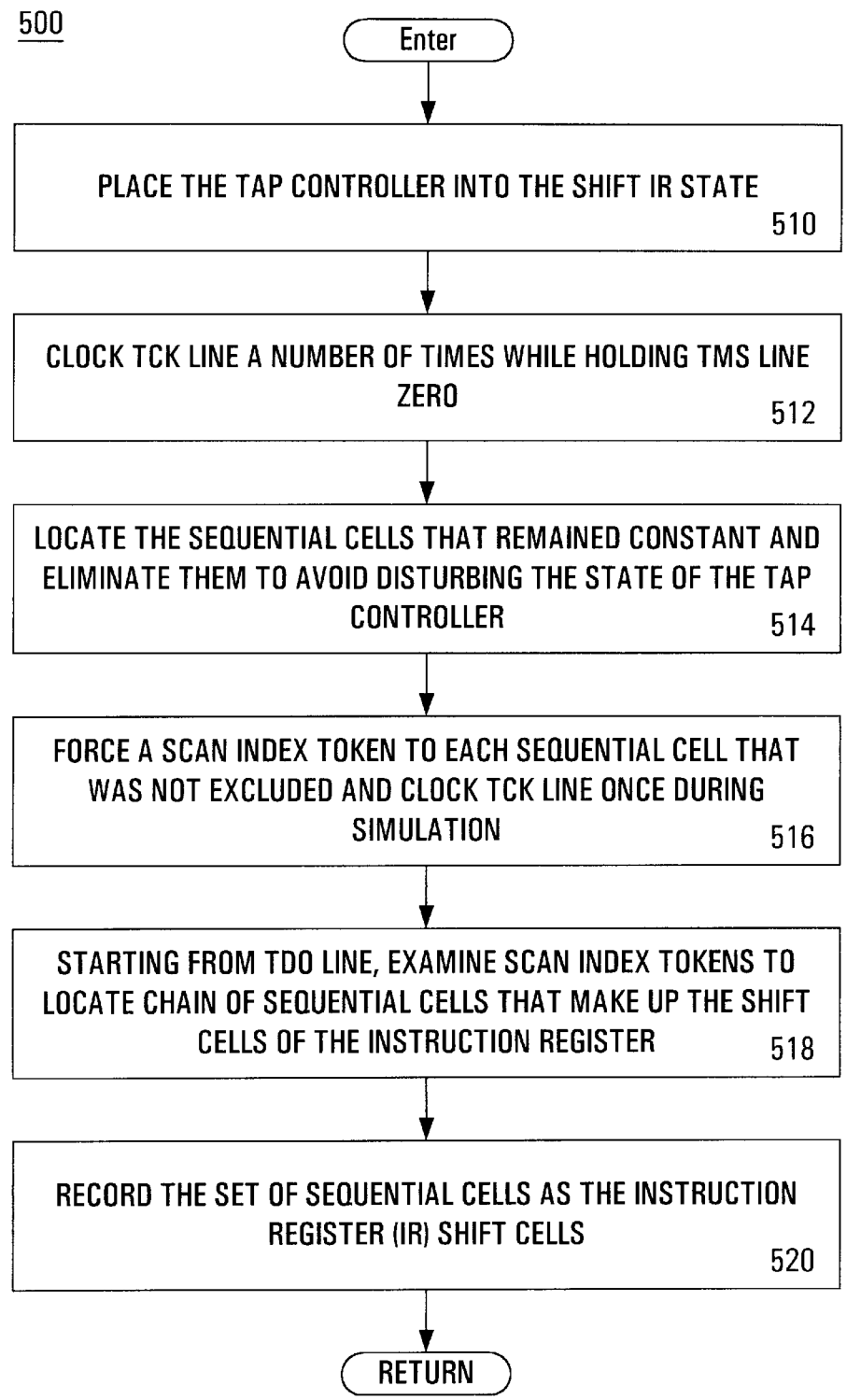
FIG. 16 is a flow diagram illustrating steps of the present invention for locating the shift cells (SRS) of the instruction register of an input netlist design.

Extraction and Verification of SRS of IR. FIG. 16 illustrates a process 500 which is a subprocess of process 225 (FIG. 9A). Process 500 is used to obtain the SRS of the IR 655. An active element simulation (AES) is performed during this process. At step 510, the TAP controller 595 is placed into the shift-IR state 574. At step 512, the TCK line is clocked a number of lines while holding the TMS line zero. At step 514, the present invention first tries to find a set of SEs which remain constant during the shift-IR 574 TAP state. The present invention identifies those SEs that remained constant and eliminates them to avoid disturbing the state of the TAP controller 595 when scan index tokens are forced into design 10. An SE is constant during the shift-DR 560 or shift-IR 574 TAP state if it does not change its state when the TCK is clocked.

Step 514 of FIG. 16 first puts all the SEs with logic-zero and logic-one values at the time of initialization into the sets of one-set and zero-set. Then this step places a logic-unknown token on TDI and simulates one full cycle of TCK. The present invention then examines all the SEs in the two sets for any change in state. If an SE changes its state, it is removed from the set and the simulation is repeated. If no SE in either set changes its state during a simulation, the process stops. Worst case, the above AES process requires n simulations if BSR cells are initialized to constant values, n being the length of the BSR 410.

The SEs in one-set and zero-set are marked constant. All other SEs in the design 10 are considered active during the shift process and put into a set of active SEs. At step 516, an indexed scan token is applied to every SE in the active set and to the TDI port. A single cycle of TCK is simulated and at step 518 the shift register chain between TDI and TDO is inferred by tracing the indexed scan token from TDO to TDI. TDO is selected first. At step 520, this information is recorded into the BSDD 30 (FIG. 2) as the SRS cells of the IR register 655.

Figure 17:
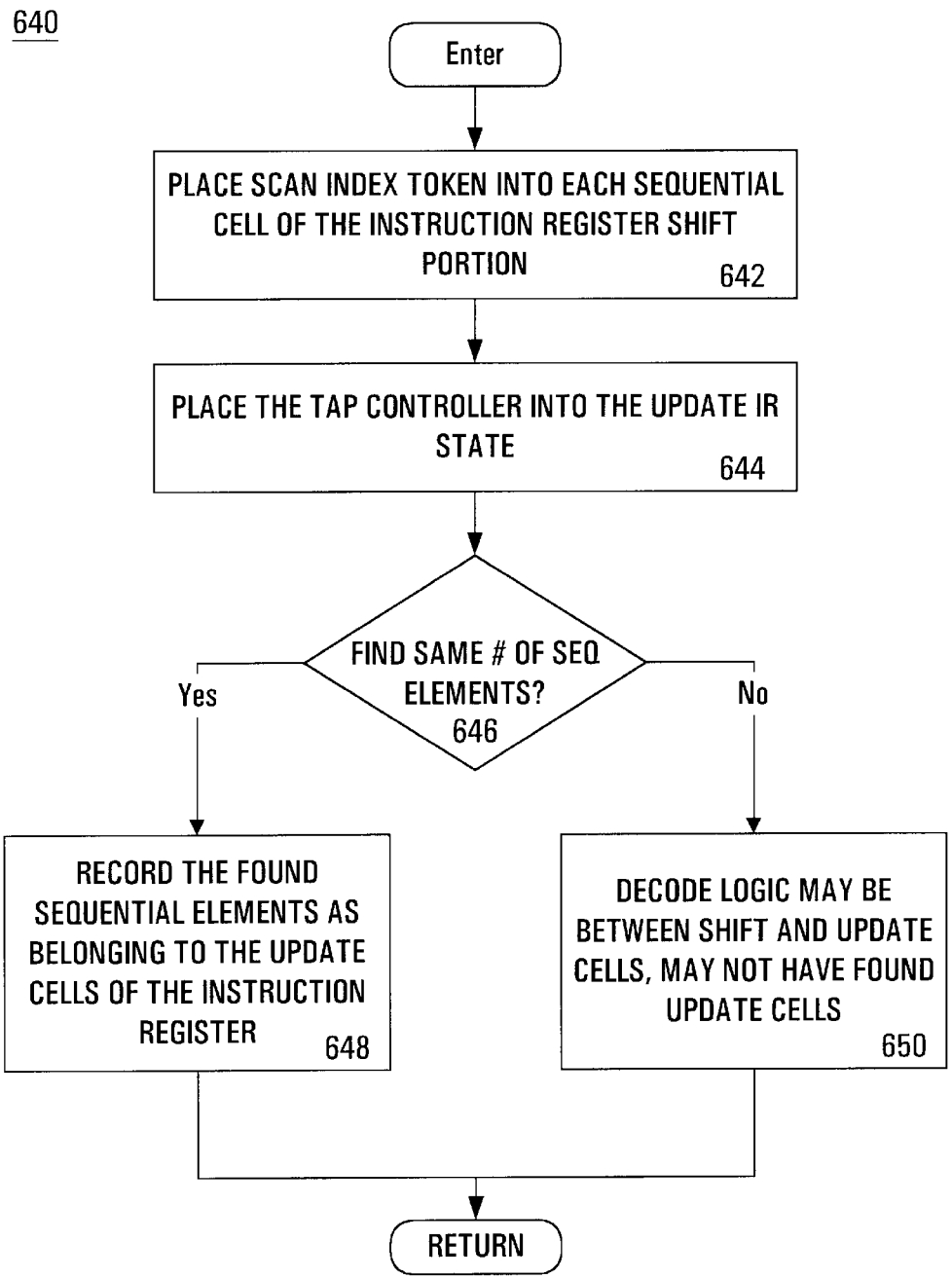
FIG. 17 is a flow diagram illustrating steps of the present invention for locating the update cells (URS) of the instruction register.

Extraction and Verification of URS of IR. FIG. 17 illustrates process 640, a subprocess of process 225 (FIG. 9A), which is used by the present invention for determining the update cells of the IR 655 once the SRS cells of the IR 655 are located. At step 642, the present invention places a scan index token into each shift register cell of the IR 655. At step 644, the TAP controller 595 is placed into the update-IR state 582. At step 646, if the same number of IR update sequential cells are found as there are IR shift register sequential cells, then at step 648 the update register portion of the IR 655 is located. This information is updated into the BSDD 30. This condition represents the circuit embodiment 652 of FIG. 18A where the update portion 660 is directly coupled to the shift portion 654 and the instruction decode logic 655 is located after the update cells 660 of the IR 655. The shift cell portion 654 and the update cell portion 660 comprise the IR 655.

Figure 18B:
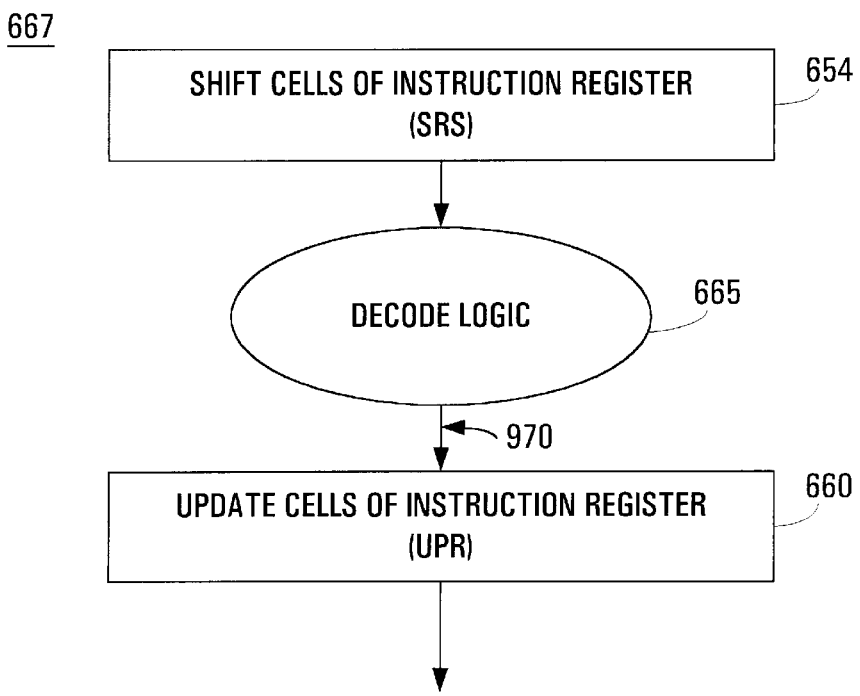

At step 646 of FIG. 17, if the number of IR update sequential cells is not found to be the same as the number of IR shift register sequential cells, then at step 650 the update register portion of the IR 655 may not be located. In this case, the circuit implementation 667 of FIG. 18B may be employed. The decode logic 665 is positioned between the shift portion 654 and the update portion 660 of the IR 655.

In this case, the update cell portion 660 is located using a different procedure described further below (see section "Locate IR Update Cells")

Figure 19:
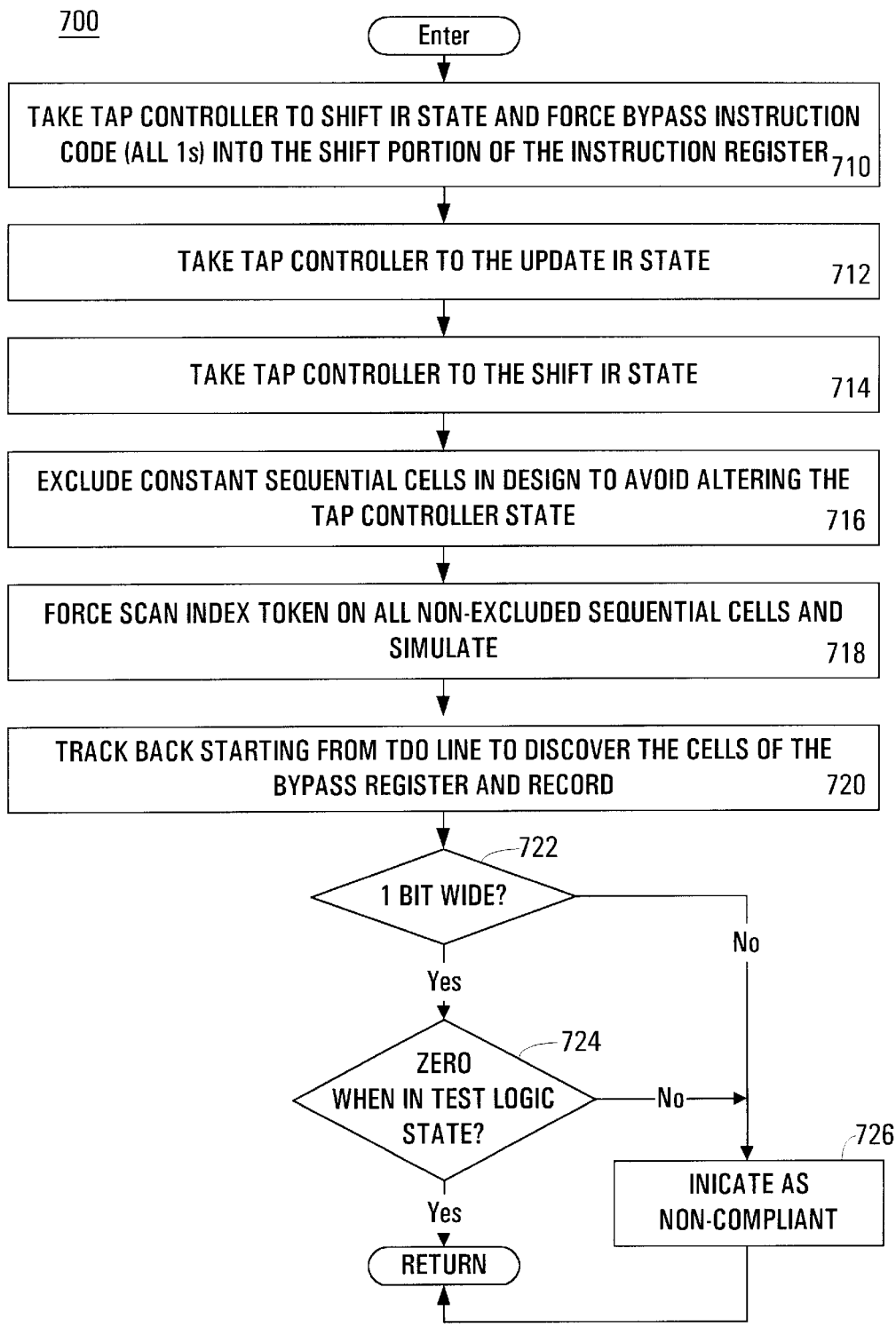
FIG. 19 is a flow diagram of the present invention used for locating the bypass test register.

Extraction and Verification of Bypass Register. FIG. 19 illustrates the steps of process 700 which is a subprocess of process 225 (FIG. 9A). Process 700 is used to extract the SRS cells of the bypass register 416. At step 710, the present invention takes the TAP controller 595 to the shift-IR state 574 and forces the bypass instruction code (all 1s) into the shift portion 654 of the IR 655. At step 712, the TAP controller 595 is taken to the update-IR state 582. At step 714, the present invention takes the TAP controller 595 to the shift-DR state 560. At step 716, the present invention first tries to find a set of SEs which remain constant during the shift-DR 560 TAP controller state. The present invention identifies those SEs that remained constant and eliminates them to avoid disturbing the state of the TAP controller 595. An SE is constant during the shift-DR 560 or shift-IR 574 TAP state if it does not change its state when the TCK is clocked. The above described AES process of steps 512–514 can be used at step 716.

At step 718 of FIG. 19, a scan index token is forced into each non-excluded SE and a simulation is performed similar to step 516. At step 720, the present invention starts at the TDO pin and traces the scan index tokens back to the TDI to locate the SRS cells of the bypass register 416. Step 720 is performed similar to step 518. At step 722, the present invention checks if the SRS portion of the bypass register 416 is exactly one bit wide. If not, then at 726 the input design 10 is marked as non-compliant with an intolerable violation. If the bypass register is exactly 1 bit wide, then at step 724 the present invention checks if the contents of the bypass register 416 is zero when the TAP controller 595 is placed into the test-logic-reset state 552. If not, then step 726 is entered. Otherwise, the BSDD 30 is populated with the information regarding the SRS portions of the bypass register 416 and process 700 returns.

Figure 20A:
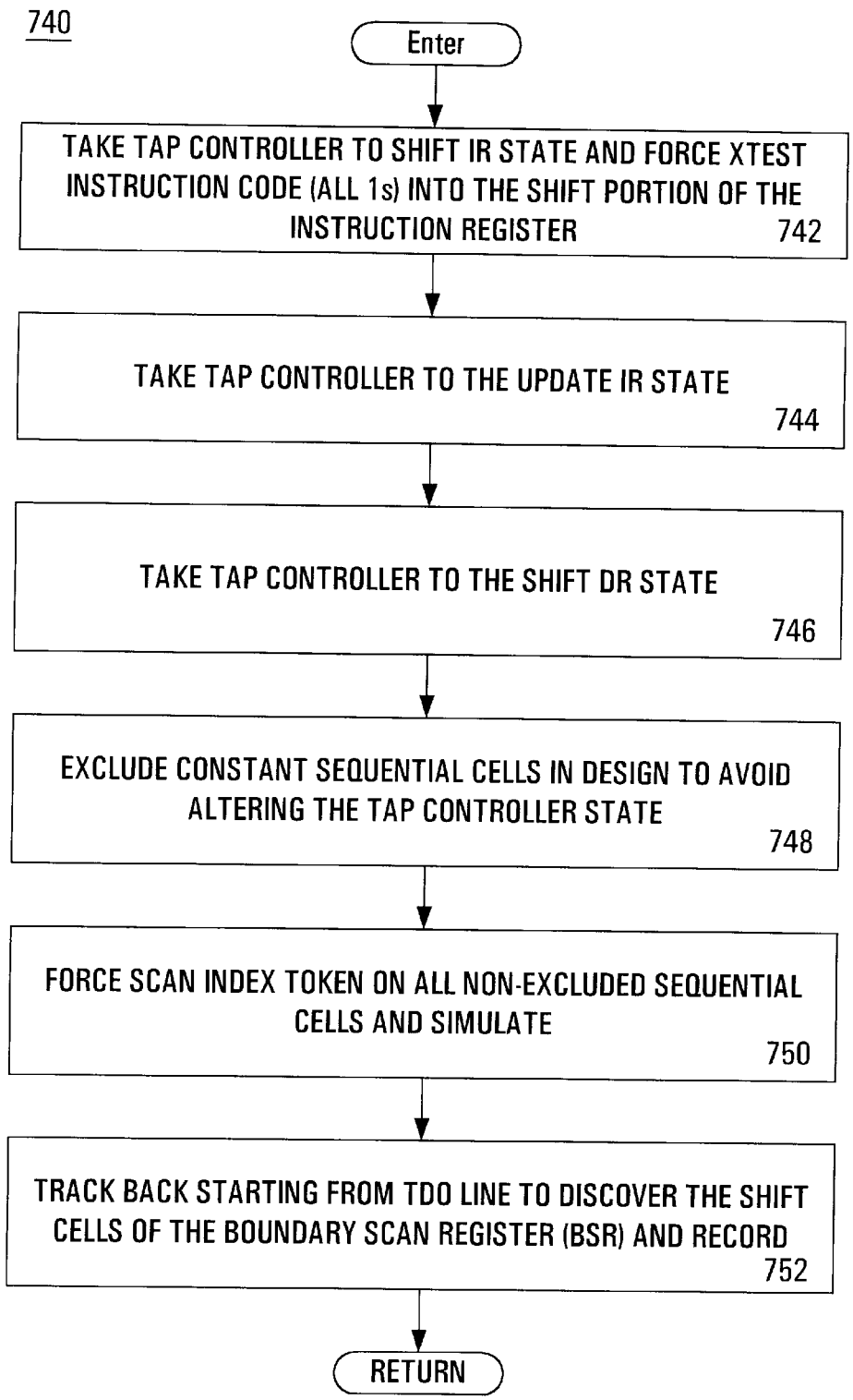
FIG. 20A is a flow diagram of the present invention for locating the shift cells (SRS) of the boundary scan register.

Extraction and Verification of SRS and URS of BSR. FIG. 20A illustrates the steps of process 740 which is a subprocess of process 225 (FIG. 9A). Process 740 is used to extract the SRS cells of the boundary scan register (BSR) 410. An exemplary shift BSR cell 372 is shown in FIG. 6A. At step 742 of FIG. 20A, the present invention takes the TAP controller 595 to the shift-IR state 574 and forces the EXTEST instruction code (all 0s) into the shift portion 654 of the IR 655. At step 744, the TAP controller 595 is taken to the update-IR state 582. At step 746, the present invention takes the TAP controller 595 to the shift-DR state 560. At step 748, the present invention first tries to find a set of SEs which remain constant during the shift-DR 560 TAP controller state. The present invention identifies those SEs that remained constant and eliminates them to avoid disturbing the state of the TAP controller 595. An SE is constant during the shift-DR 560 or shift-IR 574 TAP state if it does not change its state when the TCK is clocked. The above described AES process of steps 512–514 can be used at step 748.

At step 750, a scan index token is forced into each non-excluded SE and a simulation is performed similar to step 516. At step 752, the present invention starts at the TDO pin and traces the scan index tokens back to the TDI to locate the SRS cells of the boundary scan register 410. Step 752 is performed similar to step 518. At step 752, the BSDD 30 is populated with the information regarding the SRS portions of the BSR 410.

Figure 20B:
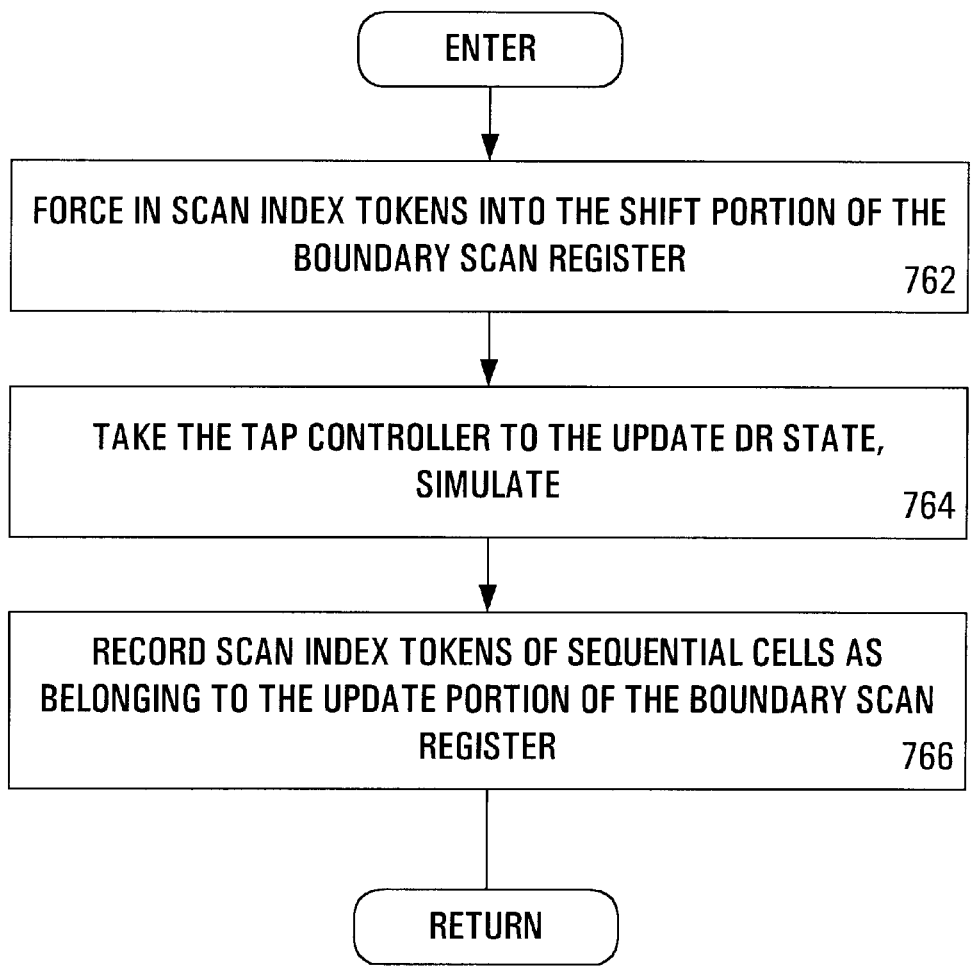
FIG. 20B is a flow diagram of the present invention for locating the update cells (URS) of the boundary scan register.
Figure 21A:
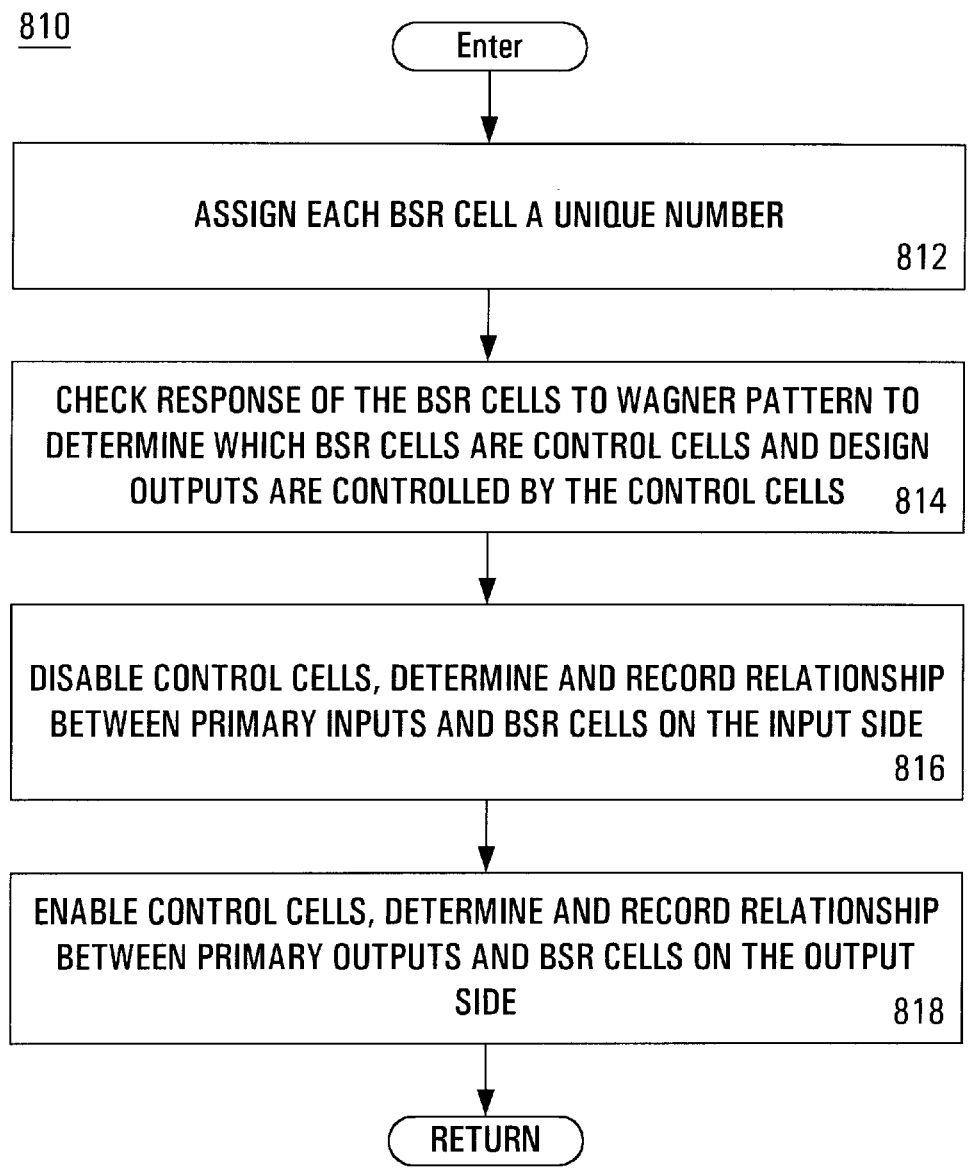
FIG. 21A is a high level flow diagram of a process of the present invention for characterizing boundary scan cells of the BSR (control, input and output).
Figure 21B:
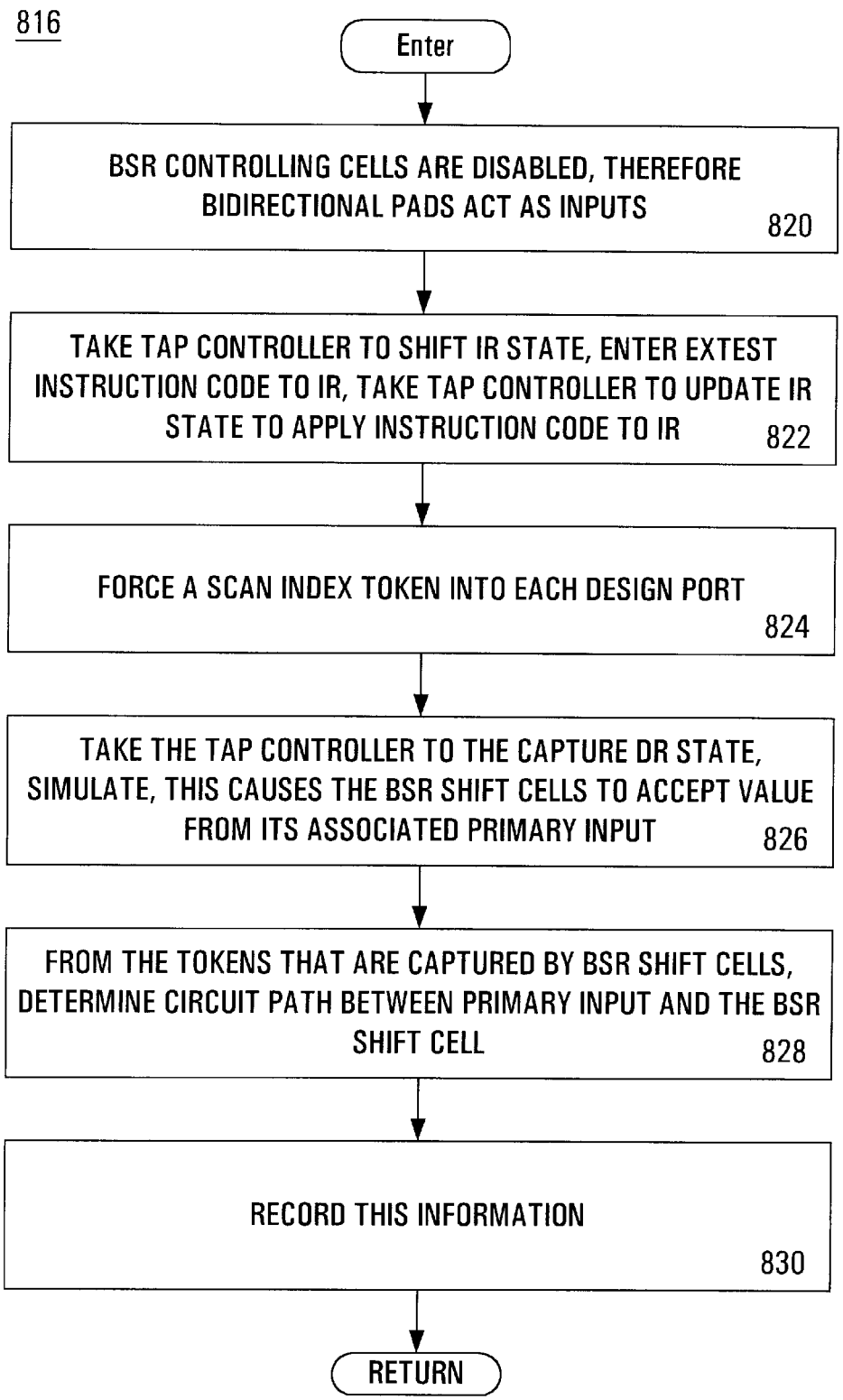
FIG. 21B is a flow diagram of a process of the present invention for identifying BSR input cells and for performing primary input characterization for the BSR input cells.
Figure 21C:
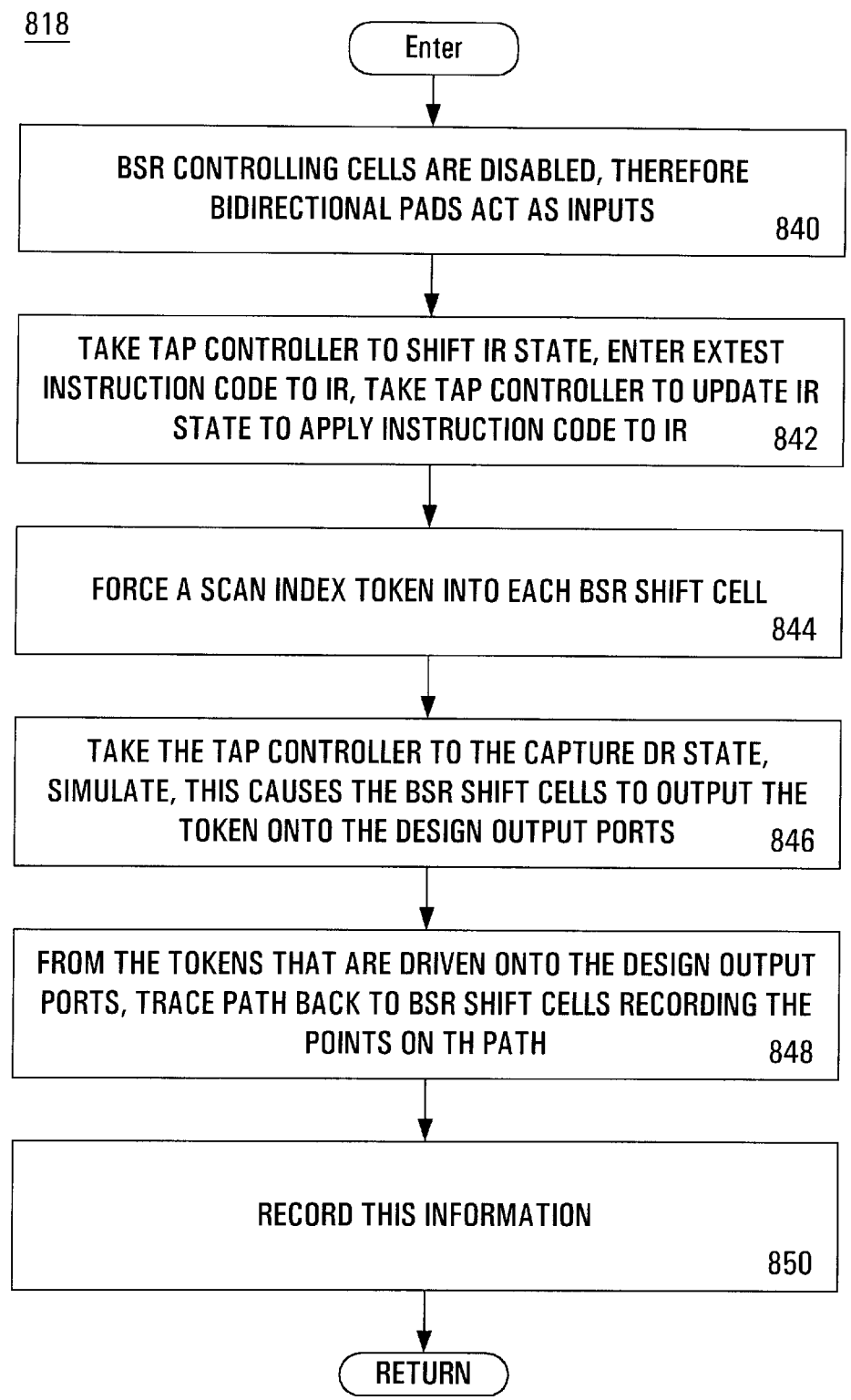
FIG. 21C is a flow diagram of a process of the present invention for identifying BSR output cells and for performing primary output characterization for the BSR output cells.

FIG. 20B illustrates a process 760 for locating the update register stage (URS) of the BSR 410. An exemplary update BSR cell 374 is shown in FIG. 6A. Process 760 of FIG. 20B is a subprocess of process 225 (FIG. 9A). At step 762, scan index tokens are forced into the shift portion of the BSR. At step 764, the TAP controller 595 is taken to the update-DR state 568 and a simulation is performed. At step 766, the present location of the inserted tokens is located and these SEs are recorded into the BSDD 30 as the update portion of the BSR 410. At this point, all of the BSR cells have been located. A BSR cell is either an input, output or control cells. Processing shown in FIGS. 21A–21C is used to further characterize the BSR cells.

Figure 20C:
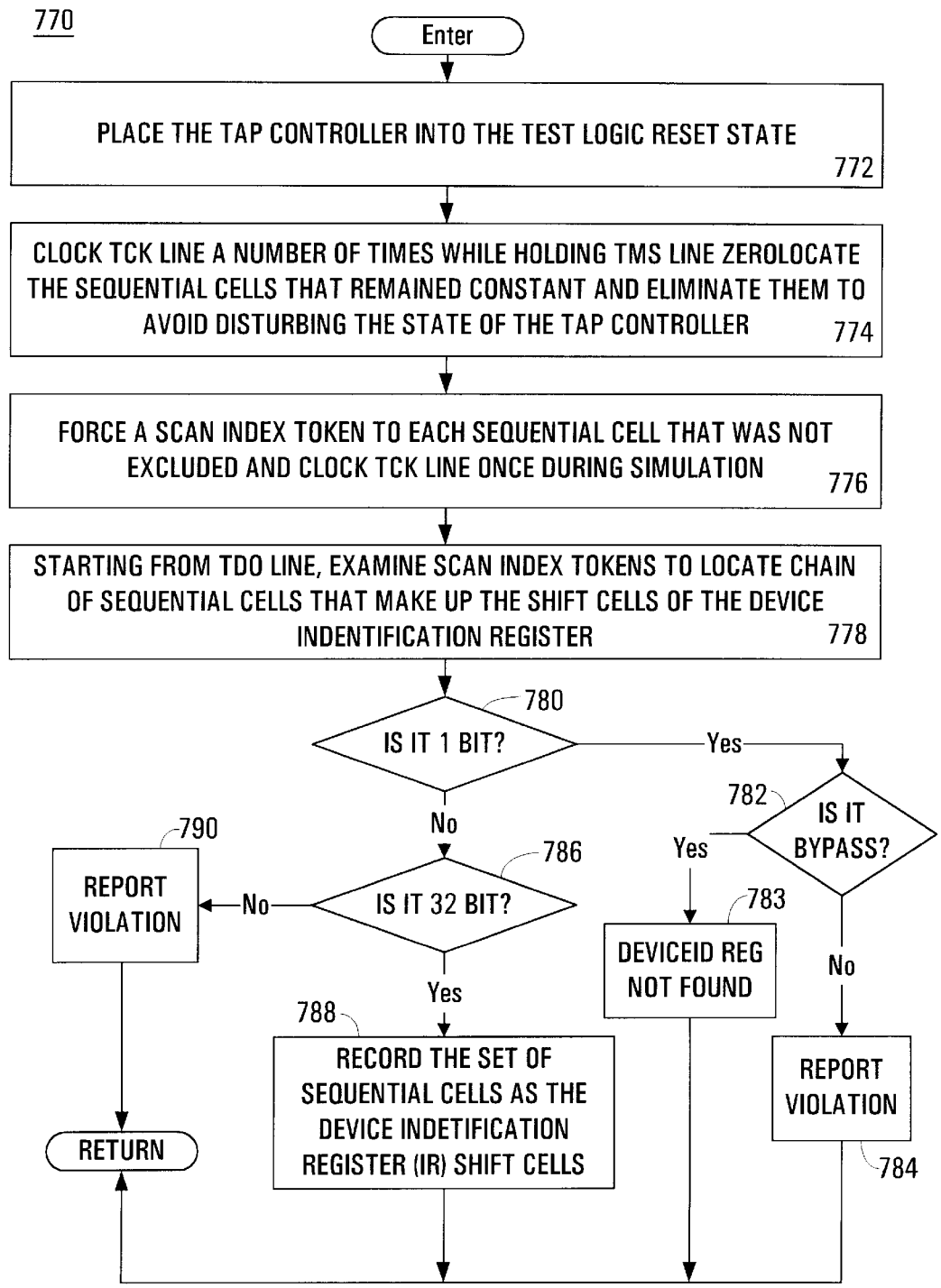
FIG. 20C is a flow diagram of the present invention for locating the shift cells (SRS) of the device identification register.

Extraction and Verification of Device ID Register. FIG. 20C illustrates a process 770 which is a subprocess of process 225 (FIG. 9A). Process 770 is used to obtain the cells of the device_ID register 412. At step 772, the TAP controller 595 is placed into the test-logic-reset state 552. At step 774, the present invention first tries to find a set of SEs which remain constant during the shift-DR 560 TAP controller state. The present invention clocks TCK and identifies those SEs that remained constant and eliminates them to avoid disturbing the state of the TAP controller 595. An SE is constant during the shift-DR 560 or shift-IR 574 TAP state if it does not change its state when the TCK is clocked. The above described AES process of steps 512–514 can be used at step 774.

Like step 516 of FIG. 20C, step 776 places a scan index token on each SE that was not excluded and clocks TCK once. At step 778, like step 518, the shift register chain between TDI and TDO is inferred by tracing the index scan token from TDO to TDI. The cells found should be the device_ID register 412. At step 780, the present invention checks if the device_ID register 412 is only 1 bit in length. If so, then at step 782 a check is made if the SEs located at step 778 are of the bypass register 416 that was previously located. If not, then a non-compliance violation is reported at step 784 because the user tried to implement the device_ID register 412 but failed. If the bypass register is located at step 782, then step 783 is entered where it is determined that the device_ID register has not been found. At step 780, if the register is larger than 1 bit, a check is made at step 786 if it is a 32-bit register (the only other option). If not, then at step 790, a non-compliance violation is reported. If the register is 32 bits at step 786, then at step 788 the located SEs of step 778 are recorded into the BSDD 30 (FIG. 2) as the cells of the device_ID register 412.

Characterize the BSR Cells. During Phase 3 (FIG. 9A) the BSR cells are characterized as BSR input, BSR output or BSR control cells at process 230. Process 810 of FIG. 21A is a subprocess of processes 230 and 235 of FIG. 9A. At step 812 of FIG. 21A, the present invention assigns each BSR cell a unique number for reference. At step 814, the present invention checks the response of the BSR cells to a Wagner pattern of bits to determine which of the BSR cells are control BSR cells and also to determine which design outputs are controlled by these control BSR cells.

Wagner patterns, see Wagner, P. T., "Interconnect Testing with Boundary-Scan", International Test Conference 1987, pp 52–57, are applied to the shift-register stage of all the boundary scan cells of the BSR 410 and the response and activity of each design output is stored. Analysis of each port's response and activity allows the present invention to infer the boundary scan cell that controls it.

Figure 22:
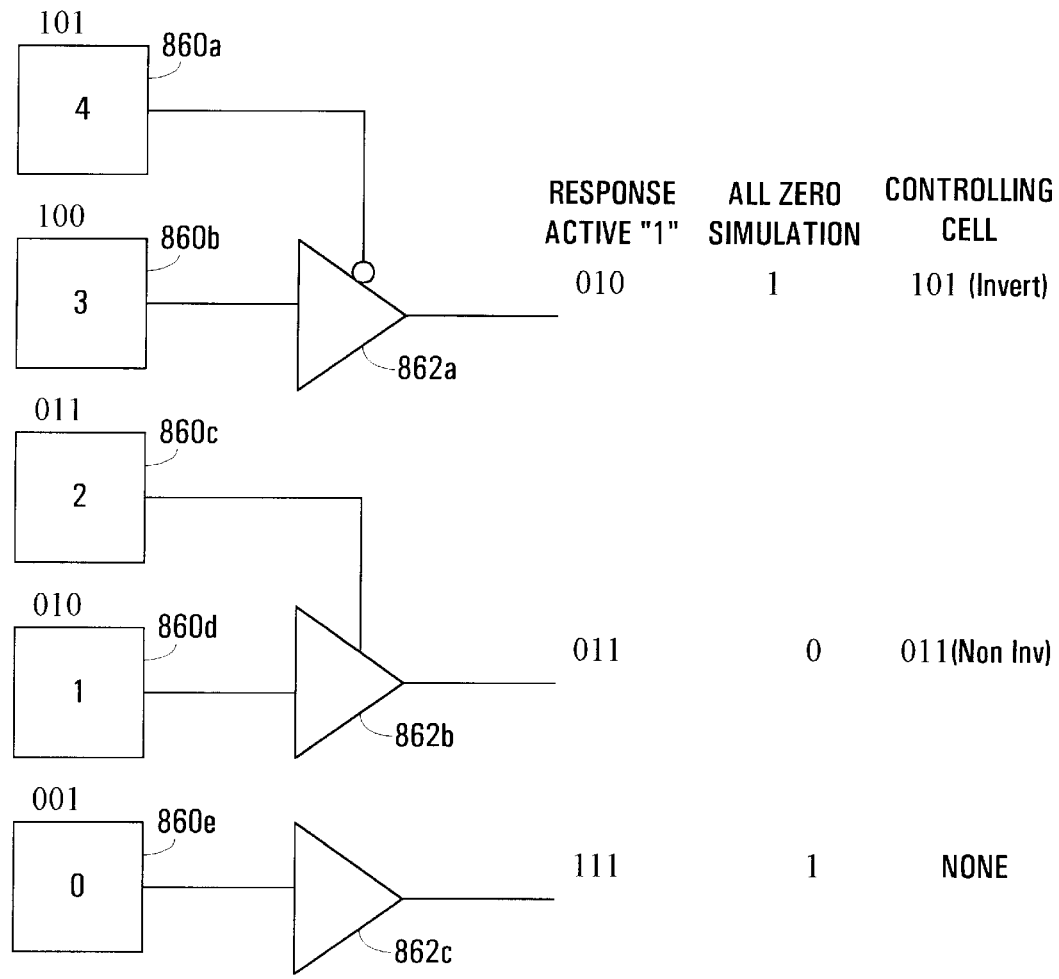
FIG. 22 illustrates an example of Wagner patterns applied to the shift-register cells (SRS) of the BSR cells in accordance with the present invention.

For instance, refer to FIG. 22. Given a unique code to all the BSR SRS sequential element from 1 to n (elements 860e–860a), step 814 puts the code in terms of 'P' bit value, where P=[log2 (n+1)]. Step 814 applies one bit of each BSR SRS sequential element code to itself and simulates, then records the value at all the design output or bi-directional ports as "1" if active and "1" if not, see column 866 of FIG. 22. Step 814 then stores the response of the 'P' simulation on each considered port into a 'P' p bit number. Then all zero states are applied to the BSR SRS sequential elements and the response on all the considered ports is recorded.

If the response of all simulation is active, e.g., "1", then the port is a 2-state output. However, if the response for all of the zeros simulation is "1", e.g., active, then the controlling cell is the cell whose code is generated by inverting the p-bit number recorded as part of responses on the port. The controlling therefore value is "0". Otherwise, the P-bit number identifies the code of the BSR SRS sequential elements which controls the output port and the controlling value is "1". Step 814 then obtains the position of the BSR cell using (n−i) where n is the number corresponding to the bit value found as above.

At step 816 of FIG. 21A, once obtaining the set of BSR control cells, the present invention disables the BSR control cells so that corresponding pads are only able to input data. In this mode, only the BSR input cells (e.g., cells like cell 330a of FIG. 6A) are active during simulation. Step 816 discovers which BSR cells are input cells and also determines information about the relationships between the primary inputs (line 390 of FIG. 6A) and the shift cell (FF 372) of the input cells. It is appreciated that the primary outputs for the input cell 330a are not yet inferred.

Step 818 is described in more detail in FIG. 21C. At step 818 of FIG. 21A, once obtaining the set of BSR control cells, the present invention enables the BSR control cells so that corresponding pads are only able to output data. In this mode, only the BSR output cells (e.g., cells like cell 330c of FIG. 6B) are active during simulation. At step 816 the output BSR cells are determined and information regarding the relationships between the primary outputs (line 354 of FIG. 6B) and the update cell (FF 396) of the output cells is also determined. Step 818 is described in more detail in FIG. 21C. It is appreciated that the primary inputs for the output cell 330c are not yet inferred.

Determine BSR Input Cells and Characterize PI. Step 816 is described with reference to FIG. 218B. At step 820, the BSR control cells are disabled and therefore any bi-directional design pads (see FIG. 4) act as inputs. At step 822, the TAP controller 595 is taken to the shift-IR state 574 and the EXTEST instruction code (all 0s) is shifted into the SRS cells of the IR 655. The TAP controller 595 is then taken to the update-IR state 582 to apply the instruction to the update cells of the IR 655. At step 824, a scan index token is forced into each design port.

At step 826 of FIG. 21B, the TAP controller 595 is then taken to the capture-DR state 558 and a simulation is performed to transfer the tokens. In EXTEST mode, the BSR cells should capture the value on the primary input. This causes the BSR shift cells (FF 372 of FIG. 5) to capture the tokens from their associated primary inputs (line 390 of FIG. 5). The tokens in each SRS cell are analyzed and the present invention determines the points along the circuit path from the primary input to the SRS cell (FF 372). The relationships between BSR cells and primary inputs are then recorded into the BSDD 30. At this stage, the present invention infers the primary inputs for each input BSR cell 330a. However, the primary output for each BSR cell 330a remains yet to be determined.

Determine BSR Output Cells and Characterize PO. Step 818 is described with reference to FIG. 21C. At step 840, the BSR control cells are enabled and therefore any bi-directional design pads (see FIG. 4) act as outputs. At step 842, the TAP controller 595 is taken to the shift-IR state 574 and the EXTEST instruction code (all 0s) is shifted into the SRS cells of the IR 655. The TAP controller 595 is then taken to the update-IR state 582 to apply the instruction to the update cells of the IR 655. At step 844, a scan index token is forced into each BSR shift cell.

At step 846 of FIG. 21C, the TAP controller 595 is then taken to the update-DR state 568 and a simulation is performed to transfer the tokens. This causes the BSR update cells (FF 396 of FIG. 5) to output the tokens to their associated primary output (line 354 of FIG. 5). At step 848, the present invention records the set of points from the update cell FF 396 to the primary outputs. Each point on this output path is recorded. The tokens in each BSR cell are analyzed and the present invention determines the points along the circuit path from the update cell FF 396 to the primary output. The relationships between BSR cells and primary outputs are then recorded into the BSDD 30. At step 850, the present invention records a set of points from the update cell to the primary outputs for each BSR output cell 330a. However, the primary inputs for each BSR outputs cell 330c are yet to be determined.

Figure 24A:
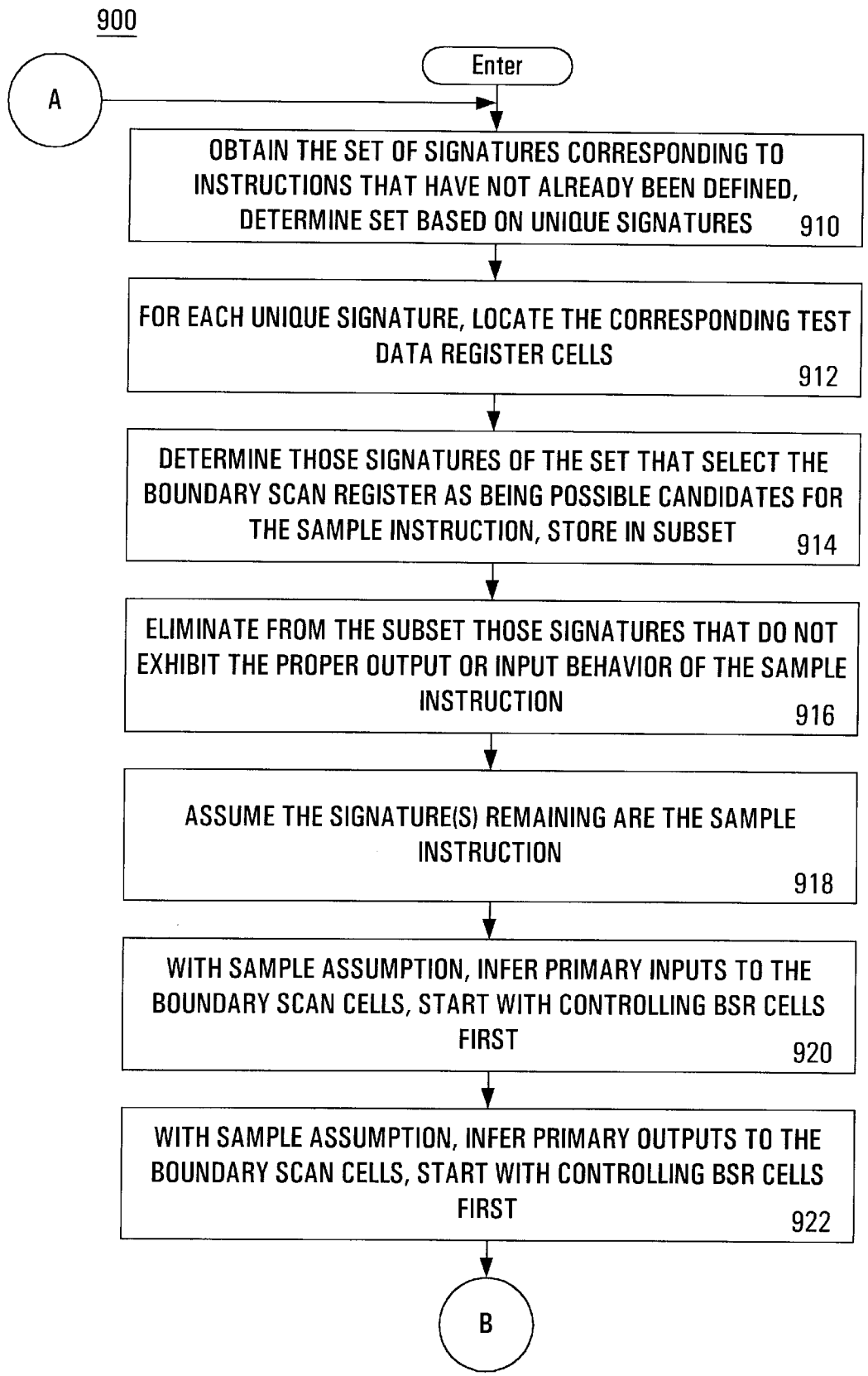
FIG. 24A illustrates steps of the present invention for identifying a set of unique signatures and for inferring the SAMPLE instruction.

Extraction of Implemented Instructions and TDRs. Phase 3 of FIG. 9A (processes 240 and 245) extracts the decoding logic of the IR 655 including the URS (update register stage 660 FIG. 18A or FIG. 18B). The decode logic needs to be extracted before process 900 of FIG. 24A is executed.

Figure 25:
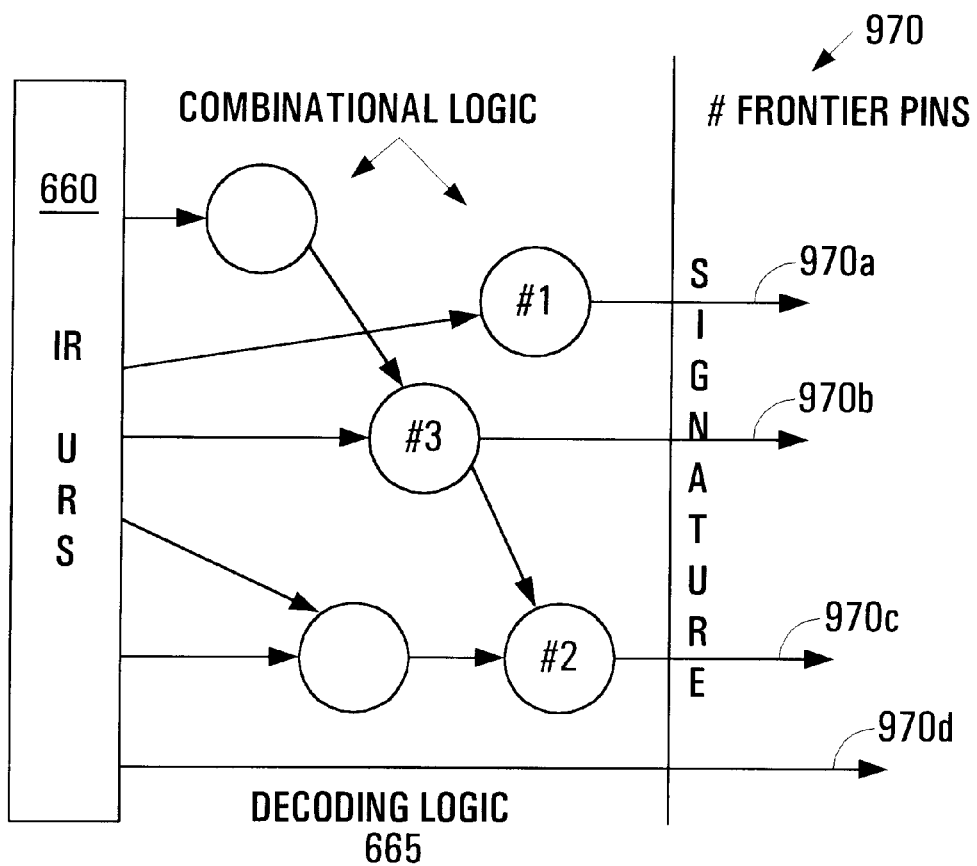
FIG. 25 illustrates a diagram of frontier pins of the instruction register used to obtain the signature values by the present invention.

Refer to FIG. 25. The value at the decoding logic frontier pins 970a–970d is used to identify the signature of all possible opcodes. It is appreciated that all the instruction opcodes which generate unique signatures, rather than unique opcodes, are extracted in accordance with the present invention. By using unique signatures as a yardstick, the present invention is able to prune the processing required to locate all unique instructions. A TDR is identified for each such set of signatures. The opcodes are then categorized by the TDR they select. The SAMPLE/PRELOAD instruction is extracted from the IR opcodes that select the BSR 410. FIG. 25 illustrates frontier pins 970a–970d. The circles represent combinational logic gates and the edges represent circuit paths between gates.

Frontier Pins by IR Update Cells. To find the frontier pins that represent the instruction signature, the decoding logic 665 needs to be located and the design 10 needs to be characterized as using implementation 652 of FIG. 18A or using the implementation 667 of FIG. 18B. If the same number of IR update register cells were found as IR shift register cells (e.g., at step 646 of FIG. 17), then the frontier pints 970 are obtained from the output of the update register cells 660 of the IR 655 and implementation 652 is assumed for design 10.

Frontier Pins by BBT Process. The BBT process 240 (FIG. 9A) is used to determine the frontier pins for designs 10 using the implementation of FIG. 18B. At this stage, the present invention places a token into each shift or update register cell of the IR 655, simulate, and determines, using the BBT process 240, which logic is driven by these cells. The BBT process 240 obtains the maximum amount of bounded logic to determine the frontier pins 970. For each node of this set, it has to be bounded exclusively by the instruction logic. If the cell is not so bounded, it is eliminated from the set to find the frontier pins.

Figure 26:
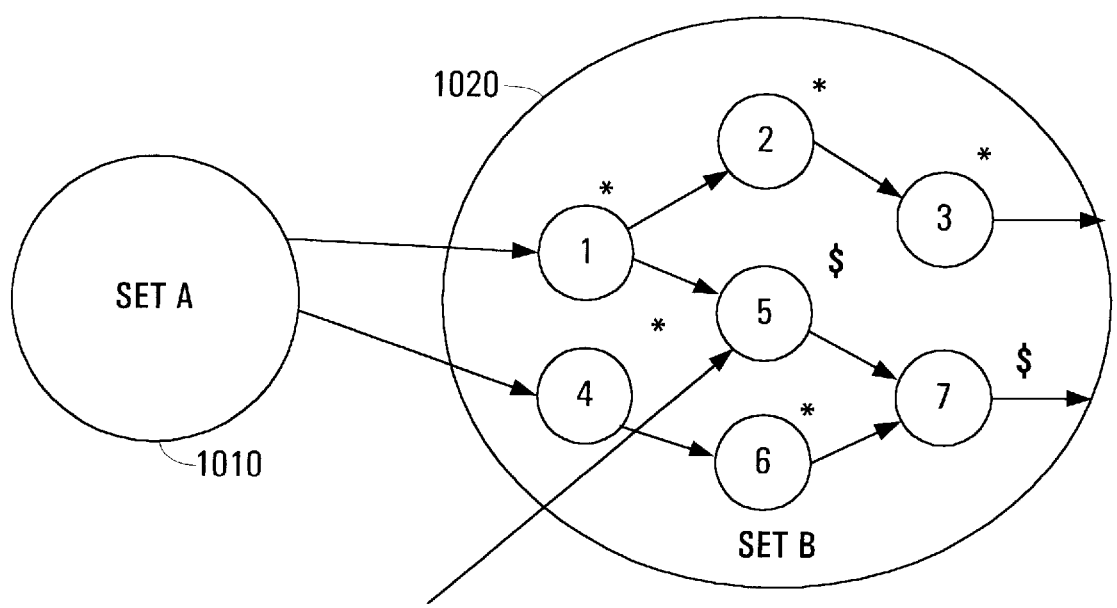
FIG. 26 is an illustration of the bounded backward trace (BBT) process of the present invention.

BBT Process 240. The following describes the Bounded Backward Trace (BBT) process 240 (FIG. 9A). The BBT process 240 is used by the present invention to return a set of pins bounded by another set. Refer to FIG. 26. This accepts two sets A 1010 and B 1020 as input and returns the set of pins in B 1020 that are bounded by set A 1010. Given a set P of pins 1–7 and a pin p, pin p is bounded by set P if for all pins q such that q drives p, q is in P or q is bounded by P.

The BBT process 240 operates recursively, finding pins in set B 1020 which are not bounded by set A 1010 and removing them from the set B 1020, until all pins in set B 1020 are bounded by set A 1020. The pins in set B 1020 are analyzed by tracing backward and checking if all the pins that drive them are bounded by pins in set a 1010. If yes, then pin is marked bounded (\*) Otherwise the pin is marked not bounded ($). The BBT process 240 stops when all pins are marked. The pins marked not bounded ($) are removed.

FIG. 26 shows an example. Set A 1010 contains pins from the IR update register cell. Set B 1020 is formed by tracing forward from every pin in set A 1010 and putting all the pins into set B 1020 until a design output port or an SE is reached. Starting from pin 3, the BBT process 240 goes backward to pin 2 and pin 1 and marks pin 1 bounded, then marks pin 2 bounded and pin 3 bounded. The pin 7 is marked not bounded because pin 5 is not bounded, and pin 6 is bounded.

Locate IR Update Cells. For the implementation of FIG. 18B (update flops 660 are implemented after the decoding logic 665), once the frontier pins 970 are determined using the BBT process 240 above, the update cells 660 of the IR 655 can be located using the following process. The values enforced on the frontier points 970 should go to the update flops 660. Therefore, scan index tokens are forced into the SRS 654 of the IR 655. Then, the TAP controller 595 is taken to the update-IR stage 582. Next, the present invention examines the design 10 for all cells that capture the values and tags these cells as the update IR cells 660.

Extraction of Unique Signatures. Once the frontier pins 970 have been located above, Phase 3 of the present invention continues with processes 250 and 255 of FIG. 9B to extract all of the unique signatures representing the set of unique instructions of design 10. FIG. 24A illustrates process 900 which is a subprocess of process 250. At step 910, the present invention obtains the set of signatures that correspond to the instructions that have not already been identified. This set is determined based on unique instruction signatures not unique instruction opcodes.

Step 910 creates a mapping of distinct signatures to the set of IR opcodes generating them. A set of unique signatures is created. The signature of every instruction on the set of frontier pins 970 returned by the BBT process 240 is analyzed. Specifically, for every IR opcode, a value is locked on the IR SRS and the values of frontier set pins 970 are recorded as the instruction signature. If the signature is the same as an existing signature of the set, then the opcode is added to its set of opcodes but the signature set is not enlarged. If it is different, then a new signature is created and the opcode is added to its set of opcodes. If the signature is the same as the all-ones opcode signature, then it is not added to the set of opcodes for the all-ones or BYPASS instruction. This is because all unused instructions should be mapped to BYPASS and the signature set can become very large.

To enhance performance, on the first pass through process 900, if the instruction register 655 is less than eight bits, then the opcodes are traversed sequentially to determine the set of unique signatures at step 910. However, if the IR 655 is eight or more bits in length, one-hot bit encoding is assumed to first determine the set of unique signatures at step 910. If this set fails to comply with IEEE 1149.1, on a second pass through step 910 the present invention will traverse the opcodes sequentially when determining the set of unique signatures. This set is then checked.

It is appreciated that at step 910, the user can specifically mask off portions of the IR 655 as not being part of the instruction opcode field. In this case, these masked bits are not considered as part of the instruction register opcode. In other instances, particular mask values (bits) can be forced into the IR 655 opcode field which can be used to limit the number of possible opcodes that need to be traversed by the present invention.

At step 912, the present invention determines the cells of the TDR for each of the unique signatures located in step 910. The process performed at step 910, for each unique signature, is similar to process 740 of FIG. 20A except the all 0s opcode is replaced with the respective unique signature. Therefore, process 740, as modified above, is run for each unique signature of the set discovered at step 910. Each corresponding TDR is therefore recorded into the BSDD 30 and associated with its corresponding instruction.

At step 914 of FIG. 24A, the present invention determines those signatures that select the BSR register 410 as being possible candidates for the SAMPLE instruction. These signatures are stored in a first subset. At step 916, the present invention eliminates from the first subset those signatures whose behavior at the input or output does not match the expected behavior of the SAMPLE instruction. First, each signature is applied to the TAP controller 595 (using shift-IR 574 and update-IR 582) and if the output of the BSR cells are in tristate mode then the signature is eliminated from the first subset. Second, each signature is applied to the TAP controller 595 and if the output of the BSR cells are driven by the update cell, then the signature is eliminated from the first subset. Third, each signature is applied to the TAP controller 595 and a token is applied to the primary input. If the token is not captured by the BSR shift cell, then the signature is eliminated from the first subset.

Figure 23:
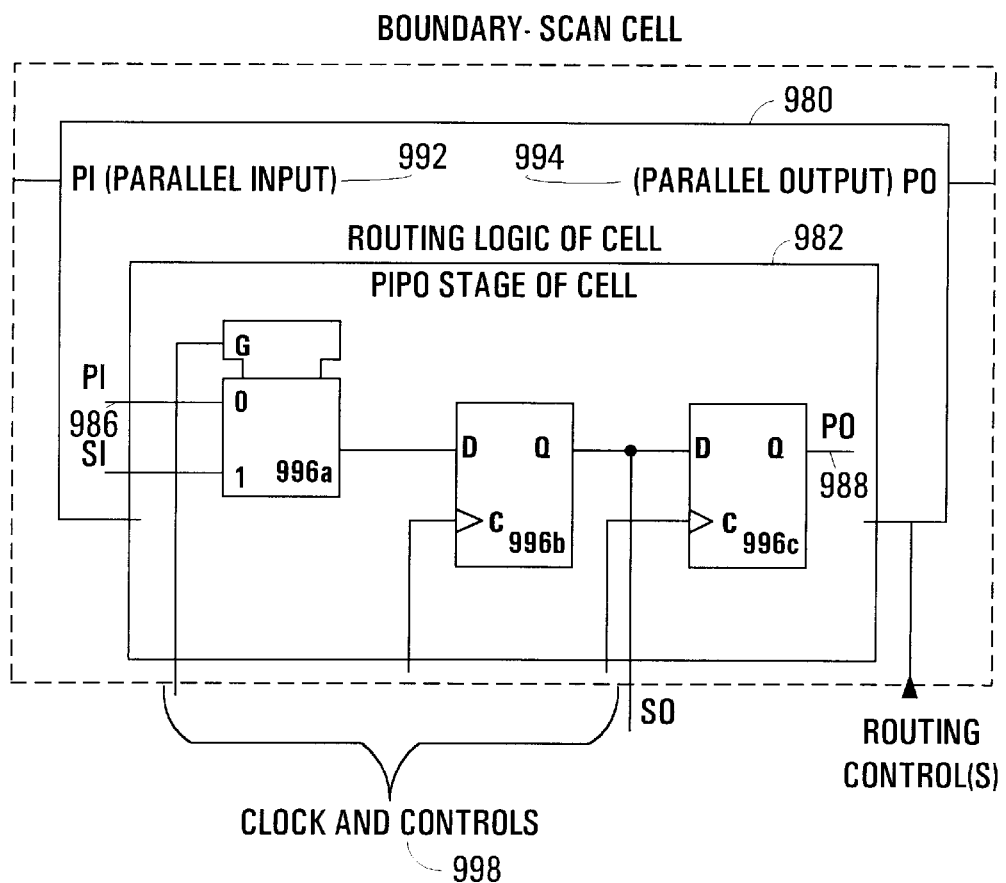
FIG. 23 illustrates control and observe BSR cells.

Process 275 (FIG. 9B) is represented by steps 918–922 of FIG. 24A. At step 918 of FIG. 24A, the remaining signatures of the first subset are assumed to the SAMPLE instruction by elimination. The SAMPLE instruction is then used to infer the remaining primary input and primary outputs that could not be identified by the processes of FIG. 21A"21C. A BSR cell can be expressed using the logic of FIG. 23. At step 920 and step 922, the primary inputs of each BSR should drive its primary outputs within the SAMPLE instruction. At step 920, the primary inputs of the output BSR cells are inferred and at step 922 the primary outputs of the input BSR cells are inferred.

Figure 24C:
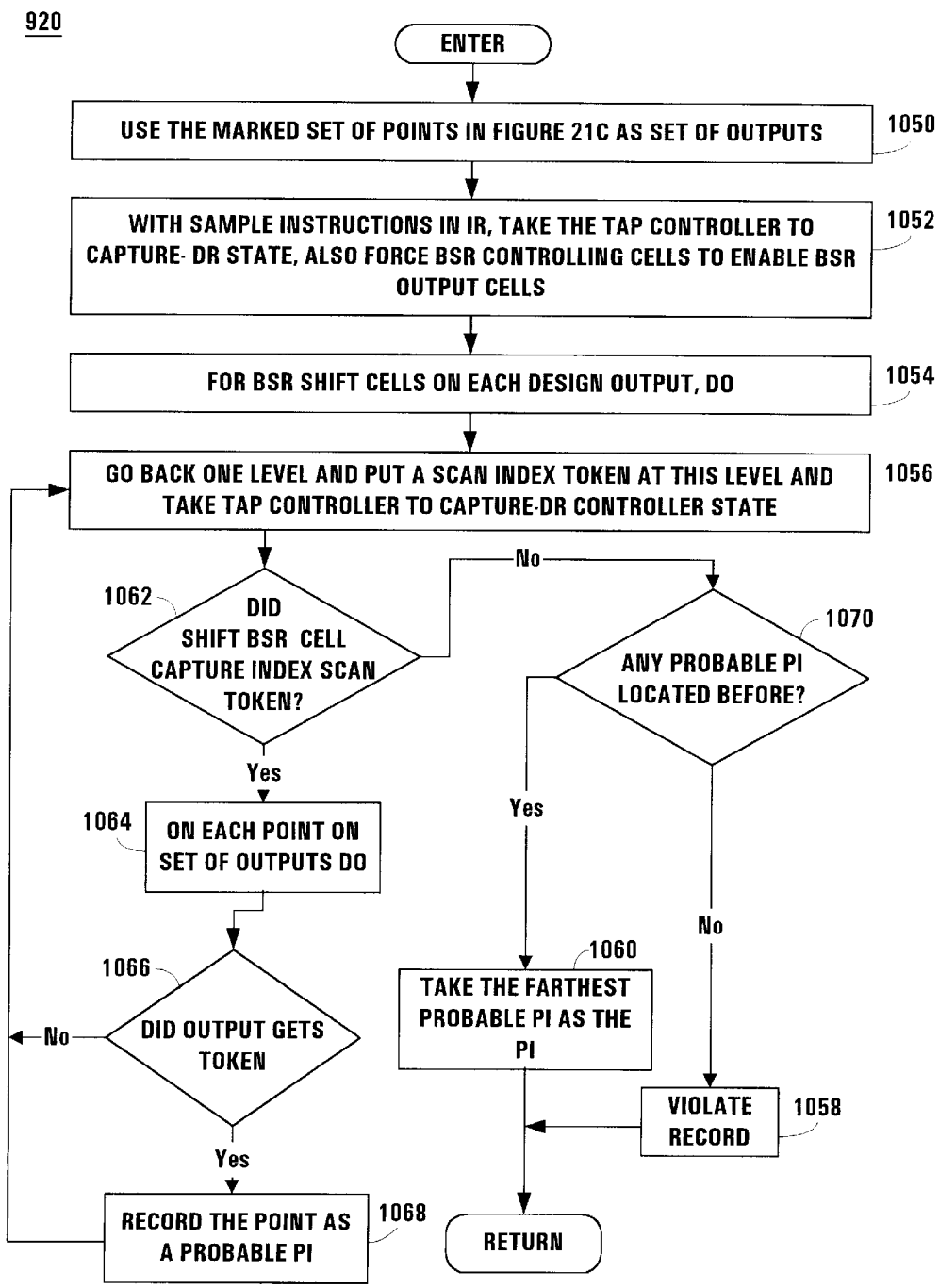
FIG. 24C illustrates steps performed by the present invention for inferring primary inputs of the input BSR cells using the inferred SAMPLE instruction.

FIG. 24C illustrates the details of step 920. At step 1050 of FIG. 24C, the present invention accesses the set of points discovered at step 848 of FIG. 21C as a set of outputs (output points). At step 1052, the inferred instruction opoode for the SAMPLE instruction is placed into the instruction register 655 and the TAP controller 595 is taken to the capture-DR state 558. The shift cells of the BSR cells in the SAMPLE mode should capture the scan index tokens in this configuration. Also at step 1052, the BSR controlling cells are enabled to enable the BSR output cells. At step 1054, for each BSR shift cell (e.g., FF 394 of FIG. 6B) on each design output, the following is performed. The circuit point (FF 394) is traced back through the input path one level to a point (e.g., to mux 392), during simulation, and a scan indexed token is put at this circuit point and the tap controller 595 is taken to the capture-DR controller state.

At step 1062, the present invention checks if the shift BSR cell captured the scan indexed token. If so, then at step 1064, for each point on the set of outputs the following is performed. In SAMPLE mode, the primary inputs are to drive the primary outputs. Therefore, to insure that the primary input was found, the present invention checks if the assumed primary input is coupled to a point of the set of points that belong to a primary output of the BSR cell. This information was discovered during the EXTEST instruction processing of FIG. 21C while in the update-DR state 568. Each point on the set of outputs is checked at step 1066 to determine if any of the points got the scan index token.

If the set of output points received the scan index token, then at step 1068 the current circuit point selected at step 1056 of FIG. 24C is considered to be a probable primary input for the current BSR cell. At step 1066, if none of the output points received the scan indexed token, then step 1056 is re-entered and the BSR circuit path is walked one level back again (e.g., from the mux 392 the circuit is traced back by one point through the input path to mux 398, etc.). At step 1062, if the shift BSR cell did not receive the scan indexed token, then step 1070 is entered. At step 1070, if no probable PIs are found, then at step 1058 a violation (non-compliance) is recorded. If probable PIs are found at step 1070, then at step 1060, the present invention takes the farthest probable PI (e.g., the one most removed back) as the PI of the current BSR output cell. By following the above sequence, the present invention locates the most extreme point believed to be the primary input for the current BSR output cell. The above is then done for each BSR output cell.

By performing the above processing, the present invention at step 920 of FIG. 24C is able to characterize the primary inputs for all BSR output cells and this information is used to update the BSDD 30. This information is useful for checking compliance for the following instructions: INTEST; RUNBIST; HIGHZ; CLAMP; and IDCODE.

Figure 24D:
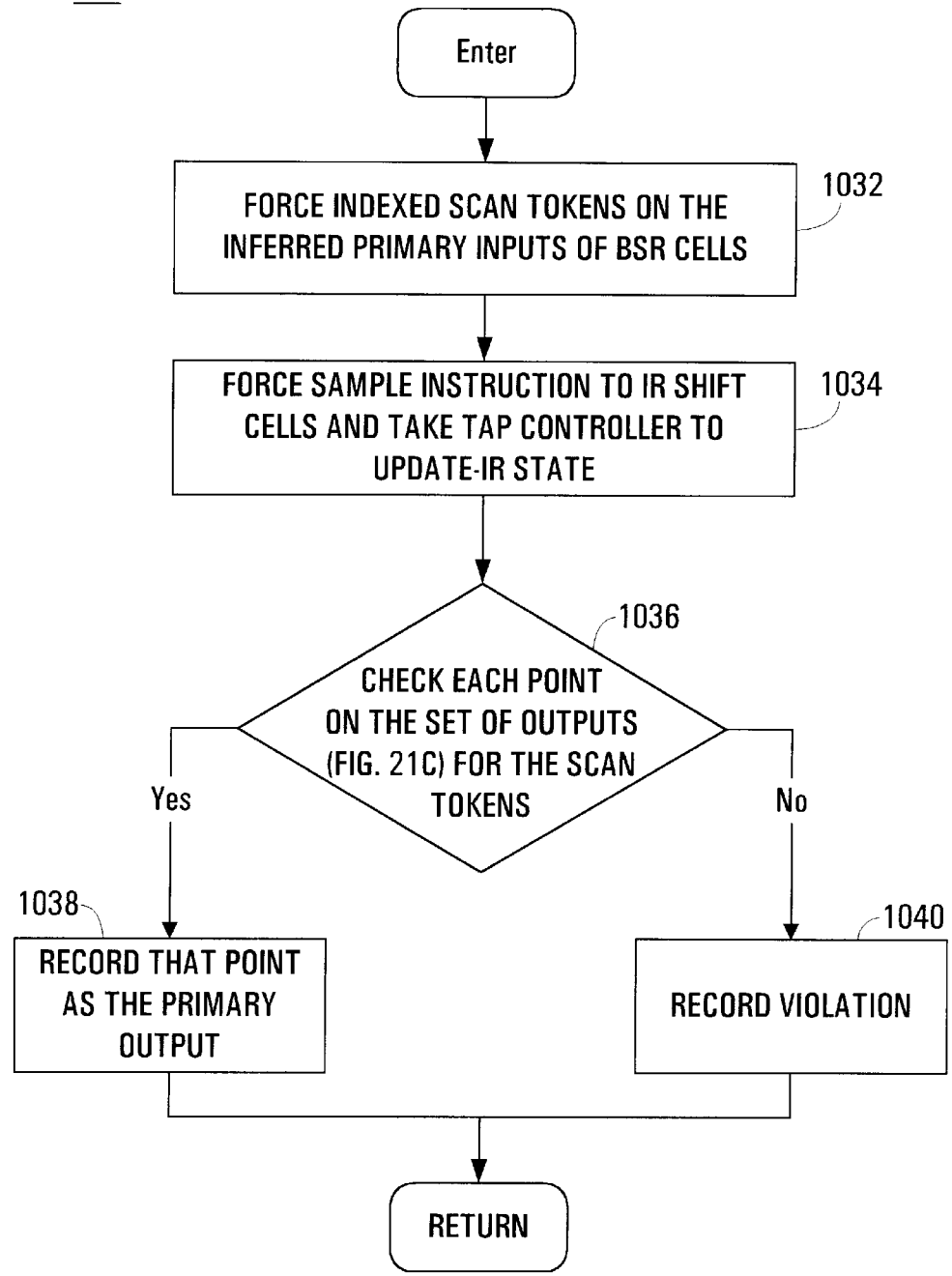
FIG. 24D illustrates steps performed by the present invention for inferring primary outputs of the input BSR cells.

At step 922 of FIG. 24A, the present invention infers the primary outputs of the BSR input cells. The details of step 922 are described with reference to FIG. 24D. It is appreciated that the steps performed in FIG. 24D are performed for each BSR input cell. At step 1032, indexed scan tokens are forced into the inferred primary inputs of the BSR cells. At step 1034, the SAMPLE instruction is forced into the IR shift cells and the TAP controller 595 is taken to the update-IR state 582. At step 1036, each point on the set of output points discussed above (for the current BSR cell) is checked to determine if any received the token. At step 1038, the point that received the token is recorded as the primary output for the current BSR cell. At step 1040, if no output received the token, then a violation (e.g., a non-compliance) is recorded. By performing the above, the present invention is able to infer all primary outputs for the BSR input cells. This information is useful for checking compliance for the following instructions: INTEST; RUNBIST; HIGHZ; CLAMP; and IDCODE.

Step 922 of FIG. 24A then analyzes all the BSR cells under the influence of each inferred instruction to functionally characterize them. It also analyzes each BSR cell structurally. It then assigns a cell type (BC__0 to BC__7) to individual BSR cells depending on their functional and structural characteristics. We classify user defined BSR cell types as BC__0.

With reference to FIG. 24B, process 900 of the present invention then infers all the implemented INTEST, RUNBIST, HIGHZ, CLAMP, and IDCODE instructions within the design 10. It also infers user defined instructions. The steps of process 900 of FIG. 24B are subprocesses of process 275 of FIG. 9B. At step 924, the present invention identifies all of the instructions that select the BSR register 410. For each signature, the present invention applies the signature to the TAP controller 595 and then determines which signatures force the design port to a tristate value or condition the design ports by the update stage of the BSR register 410. At step 924, the present invention also determines which signatures also capture a token on the primary input when the TAP controller 595 is placed in the capture-DR state 558. Those signatures that satisfy all of the above conditions are inferred as corresponding to the INTEST instruction at step 924. If more than one instruction is identified then an ambiguity is marked.

At step 926 the HIGHZ instruction is inferred by the present invention. The present invention selects all signatures that select the bypass register 416. Next, of these signatures the present invention applies each to the TAP controller 595 and determines which ones cause all of the design outputs (2 or 3 port) to enter a three-state condition or a high impedance state. These signatures are inferred as corresponding to the HIGHZ instruction. If more than one instruction is identified then an ambiguity is marked.

At step 928 of FIG. 24B the CLAMP instruction is inferred by the present invention. The present invention selects all signatures that select the bypass register 416. Next, the present invention applies each signature to the TAP controller 595 and determines which ones cause all of the design outputs to be conditioned by the update stage of the boundary scan register 410. These signatures are inferred as corresponding to the CLAMP instruction. If more than one instruction is identified then an ambiguity is marked.

At step 930, the present invention infers the IDCODE instruction. The TAP controller 595 is taken to the test-logic-reset state 552 and if a device__ID register 412 is present, the instruction that is present in the IR 655 is obtained. This should correspond to the IDCODE instruction, if this instruction is implemented, otherwise the bypass register 416 will be selected. The input and output condition is also checked. The capture states are examined for the proper output conditioning. Also, the inputs conditioning is checked, e.g., it is checked if the primary inputs or update flops are capturing.

At step 932 of FIG. 24B, the present invention checks the RUNBIST instruction. Each signature that selects the boundary scan register 410 is applied to the TAP controller 595 and then the present invention determines which signatures force the design port to a tristate value or condition the design ports by the update stage of the boundary scan register 419. The signatures that satisfy this condition are inferred as the RUNBIST instruction. If more than one instruction is identified then an ambiguity is marked. At this point, the present invention categorizes any set of unique signatures that perform the same function as ambiguous and reports this to the BSDD 30.

At step 934, the present invention determines if the set of signatures that were determined at step 910 satisfy the required instruction set of the IEEE 1149.1 standard (e.g., are the three mandatory instructions EXTEST, BYPASS and SAMPLE implemented and verified and no intolerable violations were found). If so, then the design 10 has been fully checked and the BSDD 30 is updated. If not, then at step 936, the present invention checks if another opcode traversal method can be used to obtain a broader signature set. For instance, if at step 910 a one-hot bit encoding process was used to traverse the opcode list, then at step 936 a sequential opcode traversal is used and step 910 is entered again. At step 936, if the broader opcode traversal method was already used and the data still failed to be compliant, then at step 937 a non-compliant message is generated at process 900 terminates.

With reference to FIG. 9B, pin map file 40 (FIG. 2) is then analyzed at step 280 and a BSDL writer 285 generates the BSDL output 290 from the BSDD 30. Process 200 then ends.

Tolerable Violations. Designers may violate standard rules that do not make back end tools generate bad vectors. Such violations are called tolerable violations within the present invention. Example of tolerable violations are: excluding ports from the BSR 410; omitting pull-ups from TAP ports; allocating observable BSR cells to compliance enable ports; and not mapping unused instructions opcodes to the BYPASS instruction. Tolerable violations are marked in the BSDD but do not terminate process 200.

The preferred embodiment of the present invention, a simulation based computer implemented method and system for performing extraction and compliance checking of an IEEE 1149.1 standard circuit, is thus described. While the present invention has been described in particular embodiments, it should be appreciated that the present invention should not be construed as limited by such embodiments, but rather construed according to the below claims.

What is claimed is:

1. A method for checking a netlist comprising the steps of:
    extracting state elements of a test access port (TAP) controller design within said netlist;
    traversing a plurality of states of said TAP controller to verify compliance with a set of known states;
    controlling said TAP controller to extract shift cells of an instruction register;
    extracting and verifying a bypass register of said netlist;
    extracting cells of a boundary scan register of said netlist;
    classifying cells of said boundary scan register as an input, output or control cells;
    extracting a set of frontier pins associated with decode logic coupled to said instruction register;
    traversing instruction opcodes through said instruction register and examining said frontier pins to determine a set of unique signatures;
    extracting a test data register for each unique signature of said set of unique signatures;
    extracting primary inputs and primary outputs of each cell of said boundary scan register; and
    updating a design database for each extracted element that complies with a predefined definition.

2. A method as described in claim 1 further comprising the steps of:
    inferring an INTEST instruction based on a signature of said set of unique signatures that, when applied to said TAP controller, exhibits proper conditioning of said primary inputs and primary outputs of each boundary scan register cell;
    inferring a HIGHZ instruction based on a signature of said set of unique signatures that, when applied to said TAP controller, drives said primary outputs to a high impedance state;
    inferring a CLAMP instruction based on a signature of said set of unique signatures that, when applied to said TAP controller, exhibits proper conditioning of said primary outputs of each bypass register cell;
    inferring a IDCODE instruction of said set of unique signatures; and
    inferring a RUNBIST instruction of said set of unique signatures.

3. A method as described in claim 1 further comprising the step of receiving a TAP port definition of said netlist defining TDI, TDO, TMS, and TCK pins and receiving a set of compliance enable ports of said netlist.

4. A method as described in claim 1 wherein said step of extracting state elements of a test access port controller design within said netlist comprises the steps of:

using a data propagation and filtering process to locate a probable set of state elements corresponding to said TAP controller using symbolic simulation; and using a closure pruning process to prune said probable set of state elements located by said data propagation and filtering process.

5. A method as described in claim 1 wherein said step of controlling said TAP controller to extract shift cells of an instruction register comprises the steps of:

forcing said TAP controller into a shift-IR state;

using an active element simulation, determining a set of sequential cells within said netlist that remain constant;

applying tokens to said set of sequential cells that remain constant and simulating over once clock cycle; and recording said shift cells of said instruction register by starting from TDO and traversing backwards to TDI following a path indicated by said tokens.

6. A method as described in claim 1 wherein said step of extracting and verifying a bypass register of said netlist comprises the steps of:

forcing a predetermined BYPASS instruction code into said TAP controller;

using an active element simulation, determining a set of sequential cells within said netlist that remain constant;

applying tokens to said set of sequential cells that remain constant and simulating a shift-DR state;

recording a set of shift cells of said bypass register by starting from TDO and traversing backwards to TDI following a path indicated by said tokens; and verifying that said bypass register is at least one bit wide.

7. A method as described in claim 1 wherein said step of extracting cells of a boundary scan register of said netlist design comprises the steps of:

forcing a predetermined EXTEST instruction code into said TAP controller;

using an active element simulation, determining a set of sequential cells within said netlist that remain constant;

applying first tokens to said set of sequential cells that remain constant and simulating a shift-DR state; and recording a set of shift cells of said boundary scan register by starting from TDO and traversing backwards to TDI following a path indicated by said first tokens.

8. A method as described in claim 7 wherein said step of extracting cells of a boundary scan register further comprises the step of:

applying second tokens to said set of shift cells of said boundary scan register;

forcing said TAP controller to an update-DR state;

recording a set of update cells of said boundary scan register by examining those cells of said netlist that received said second tokens.

9. A method as described in claim 1 wherein said step of classifying cells of said boundary scan register as an input, output or control cells comprises the steps of:

applying a Wagner pattern to determine which cells of said boundary scan register are control cells;

disabling said control cells of said boundary scan register, simulating first tokens placed on design ports of said netlist and determining input cells of said boundary scan register by those cells that capture said first tokens;

enabling said control cells of said boundary scan register, simulating tokens placed in each cell of said boundary scan register and determining output cells of said boundary scan register by those cells that output to a design output port of said netlist.

10. A method as described in claim 1 wherein said step of extracting a set of frontier pins associated with decode logic coupled to said instruction register comprises the steps of:

using a portion of said instruction register to determine said frontier pins if said decode logic is placed after said instruction register; and using a bounded backward trace process and simulation to determine said frontier pins if said decode logic is placed between shift cells and update cells of said instruction register.

11. A method as described in claim 1 wherein said step of traversing opcodes through said instruction register and examining said frontier pins to determine a set of unique signatures comprises the steps of:

using sequential opcode traversal to determine said set of unique signatures provided said instruction register is less than a predetermined number of bits; and using one-hot encoding opcode traversal to determine said set of unique signatures provided said instruction register is equal to or more than said predetermined number of bits.

12. A method as described in claim 1 wherein said step of extracting a test data register for each unique signature comprises the steps of:

applying a unique signature to said TAP controller;

using an active element simulation, determining a set of sequential cells within said design that remain constant;

applying tokens to said set of sequential cells that remain constant and simulate a shift-DR state; and recording a set of shift cells as a test data register associated with said unique signature by starting from TDO and traversing backwards to TDI following a path indicated by said tokens.

13. A method as described in claim 1 wherein said step of extracting primary inputs and primary outputs of each cell of said boundary scan register comprises the steps of:

inferring a SAMPLE instruction by eliminating signatures of said set of unique signatures that do not exhibit a predefined SAMPLE behavior; and characterizing primary inputs of output cells of said boundary scan register by the following steps:

applying said SAMPLE instruction to said TAP controller;

tracing backward, from a shift cell of a boundary scan register cell, to an extreme most point, said extreme most point characterized in that a token placed thereon is captured by said shift cell during simulation; and testing if a token placed at said extreme most point is also output over a known output point of said boundary scan register cell.

14. A computer system comprising a process coupled to a bus and a memory unit coupled to said bus, wherein instructions stored in said memory unit, when executed by said processor, implement a method for checking a netlist, said method comprising the steps of:

extracting state elements of a test access port (TAP) controller design within said netlist;

traversing a plurality of states of said TAP controller to verify compliance with a set of known states;

controlling said TAP controller to extract shift cells of an instruction register;

extracting and verifying a bypass register of said netlist;

extracting cells of a boundary scan register of said netlist;

classifying cells of said boundary scan register as an input, output or control cells;

extracting a set of frontier pins associated with decode logic coupled to said instruction register;

traversing instruction opcodes through said instruction register and examining said frontier pins to determine a set of unique signatures;

extracting a test data register for each unique signature of said set of unique signatures;

extracting primary inputs and primary outputs of each cell of said boundary scan register; and updating a design database for each extracted element that complies with a predefined definition.

15. A computer system as described in claim 14 wherein said method further comprises the steps of:

inferring an INTEST instruction based on a signature of said set of unique signatures that, when applied to said TAP controller, exhibits proper conditioning of said primary inputs and primary outputs of each boundary scan register cell;

inferring a HIGHZ instruction based on a signature of said set of unique signatures that, when applied to said TAP controller, drives said primary outputs to a high impedance state;

inferring a CLAMP instruction based on a signature of said set of unique signatures that, when applied to said TAP controller, exhibits proper conditioning of said primary outputs of each bypass register cell;

inferring a IDCODE instruction of said set of unique signatures; and inferring a RUNBIST instruction of said set of unique signatures.

16. A computer system as described in claim 14 wherein said method further comprises the step of receiving a TAP port definition of said netlist defining TDI, TDO, TMS, and TCK pins and receiving a set of compliance enable ports of said netlist.

17. A computer system as described in claim 14 wherein said step of extracting state elements of a test access port controller design within said netlist comprises the steps of:

using a data propagation and filtering process to locate a probable set of state elements corresponding to said TAP controller using symbolic simulation; and using a closure pruning process to prune said probable set of state elements located by said data propagation and filtering process.

18. A computer system as described in claim 14 wherein said step of controlling said TAP controller to extract shift cells of an instruction register comprises the steps of:

forcing said TAP controller into a shift-IR state;

using an active element simulation, determining a set of sequential cells within said netlist that remain constant;

applying tokens to said set of sequential cells that remain constant and simulating over once clock cycle; and recording said shift cells of said instruction register by starting from TDO and traversing backwards to TDI following a path indicated by said tokens.

19. A computer system as described in claim 14 wherein said step of extracting and verifying a bypass register of said netlist comprises the steps of:

forcing a predetermined BYPASS instruction code into said TAP controller;

using an active element simulation, determining a set of sequential cells within said netlist that remain constant;

applying tokens to said set of sequential cells that remain constant and simulating a shift-DR state;

recording a set of shift cells of said bypass register by starting from TDO and traversing backwards to TDI following a path indicated by said tokens; and verifying that said bypass register is at least one bit wide.

20. A computer system as described in claim 14 wherein said step of extracting cells of a boundary scan register of said netlist design comprises the steps of:

forcing a predetermined EXTEST instruction code into said TAP controller;

using an active element simulation, determining a set of sequential cells within said netlist that remain constant;

applying first tokens to said set of sequential cells that remain constant and simulating a shift-DR state; and recording a set of shift cells of said boundary scan register by starting from TDO and traversing backwards to TDI following a path indicated by said first tokens.

21. A computer system as described in claim 20 wherein said step of extracting cells of a boundary scan register further comprises the step of:

applying second tokens to said set of shift cells of said boundary scan register;

forcing said TAP controller to an update-DR state;

recording a set of update cells of said boundary scan register by examining those cells of said netlist that received said second tokens.

22. A computer system as described in claim 14 wherein said step of classifying cells of said boundary scan register as an input, output or control cells comprises the steps of:

applying a Wagner pattern to determine which cells of said boundary scan register are control cells;

disabling said control cells of said boundary scan register, simulating first tokens placed on design ports of said netlist and determining input cells of said boundary scan register by those cells that capture said first tokens;

enabling said control cells of said boundary scan register, simulating tokens placed in each cell of said boundary scan register and determining output cells of said boundary scan register by those cells that output to a design output port of said netlist.

23. A computer system as described in claim 14 wherein said step of extracting a set of frontier pins associated with decode logic coupled to said instruction register comprises the steps of:

using a portion of said instruction register to determine said frontier pins if said decode logic is placed after said instruction register; and using a bounded backward trace process and simulation to determine said frontier pins if said decode logic is placed between shift cells and update cells of said instruction register.

24. A computer system as described in claim 14 wherein said step of traversing opcodes through said instruction register and examining said frontier pins to determine a set of unique signatures comprises the steps of:

using sequential opcode traversal to determine said set of unique signatures provided said instruction register is less than a predetermined number of bits; and using one-hot bit encoding opcode traversal to determine said set of unique signatures provided said instruction register is equal to or more than said predetermined number of bits.

25. A computer system as described in claim 14 wherein said step of extracting a test data register for each unique signature comprises the steps of:

applying a unique signature to said TAP controller;

using an active element simulation, determining a set of sequential cells within said design that remain constant;

applying tokens to said set of sequential cells that remain constant and simulate a shift-DR state; and recording a set of shift cells as a test data register associated with said unique signature by starting from TDO and traversing backwards to TDI following a path indicated by said tokens.

26. A computer system as described in claim 14 wherein said step of extracting primary inputs and primary outputs of each cell of said boundary scan register comprises the steps of:

inferring a SAMPLE instruction by eliminating signatures of said set of unique signatures that do not exhibit a predefined SAMPLE behavior; and characterizing primary inputs of output cells of said boundary scan register by the following steps:

applying said SAMPLE instruction to said TAP controller;

tracing backward, from a shift cell of a boundary scan register cell, to an extreme most point, said extreme most point characterized in that a token placed thereon is captured by said shift cell during simulation; and testing if a token placed at said extreme most point is also output over a known output point of said boundary scan register cell.

* * * * *